(12) United States Patent
Sun et al.

(10) Patent No.: US 6,772,279 B1
(45) Date of Patent: Aug. 3, 2004

(54) METHOD AND APPARATUS FOR MONITORING THE STATUS OF CAM COMPARAND REGISTERS USING A FREE LIST AND A BUSY LIST

(75) Inventors: Chih-Ping Sun, San Jose, CA (US); Wei Zhang, San Jose, CA (US); Wen-Chau Hou, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 316 days.

(21) Appl. No.: 10/093,580

(22) Filed: Mar. 7, 2002

(51) Int. Cl.[7] .............................................. G06F 12/00
(52) U.S. Cl. ........................ 711/108; 711/156; 711/221; 707/6
(58) Field of Search .................... 365/189.07; 707/3, 707/6, 7, 206; 711/108, 156, 170, 173, 209, 221; 370/380, 381

(56) References Cited

U.S. PATENT DOCUMENTS 5,623,489 A * 4/1997 Cotton et al. ............... 370/381
5,749,087 A * 5/1998 Hoover et al. .............. 711/108
6,192,048 B1 * 2/2001 Nelson et al. .............. 370/380

\* cited by examiner

*Primary Examiner*—B. James Peikari
(74) *Attorney, Agent, or Firm*—Bradley T. Sako

(57) ABSTRACT

According to one embodiment, a CAM system (100) may include a comparand register (CMPR) index block (106) for monitoring a status of comparand registers within the CAM blocks (104). A CMPR index block (106) may include a free index register set (120). A free head pointer (122) and a free tail pointer (124) can point to a start and end of a list of free comparand index values stored within a free index register set (120). A CMPR index block (106) may also include a busy index register set (126). A busy head pointer (128) and a busy tail pointer (130) can point to a start and end of a list of busy comparand index values stored within a busy index register set (126).

20 Claims, 16 Drawing Sheets

METHOD AND APPARATUS FOR MONITORING THE STATUS OF CAM COMPARAND REGISTERS USING A FREE LIST AND A BUSY LIST

TECHNICAL FIELD

The present invention relates to content addressable memories (CAMs) and particularly to the use of comparand registers within CAMs and/or CAM based systems.

BACKGROUND OF THE INVENTION

Due to the increased prevalence of information networks, including the Internet, content addressable memories (CAMs) continue to proliferate. CAMs, also referred to as "associative memories" can provide rapid matching functions that are often needed in routers and network switches to process network packets. As just one example, a router can use a matching function to match the destination of an incoming packet with a "forwarding" table. The forwarding table can provide "next hop" information that can allow the incoming packet to be transmitted to its final destination, or to another node on the way to its final destination. Of course, CAMs can also be used for applications other than network hardware.

A CAM may perform the matching functions described above by providing the ability to apply a search key or "comparand" to a table of stored data values. A CAM may then determine if any of the data values match a given search key. A typical conventional search operation, along with a general architecture of a conventional CAM system will now be described in more detail.

Referring to FIG. 9A, an example of a conventional CAM system is shown, and is designated by the general reference number 900. A conventional CAM system 900 may include a network processing unit (NPU) 902, and a number of CAM blocks 904-1 and 904-2 that may be connected by control and data signals 908.

Referring now to FIG. 9B, CAM blocks 904 are shown in more detail, and may include a CAM array 912, CAM control circuits 914, and a comparand register (CMPR) set 916.

A CAM array 912 may contain any number of CAM storage cells. Data may be written to and/or read from such CAM storage cells. A CAM array 912 may also support a search function, where a search key or "comparand" may be compared against data stored in any number of CAM storage cells. If the data in any CAM storage cell matches a comparand value, then a search hit may be indicated. Otherwise, a search miss may be indicated.

CAM control circuits 914 can take CAM control and data signalsl 908 as inputs and generate signals that may be necessary to control the operation of a CAM array 912.

A CMPR set 916 may include any number of storage locations that may be used to store comparand values used for search operations. In the particular example of FIG. 9B, a CMPR set 916 includes eight storage locations. Comparand values may be loaded into a location of a CMPR set 916 by CAM control and data signals 908.

Having described an example of a CAM based system, as well as a CAM block, a conventional CAM search operation will now be described. To perform la search operation, an NPU 902 may provide to CAM blocks 904 a comparand value as well as the location within a comparand register set 916 to store the comparand data. A comparand value may then be compared to all the CAM storage locations within a CAM array 912.

If any of the values stored in a CAM array 912 matches the comparand value, it is considered a search "hit." Various actions may be taken in response to a search hit. As an example, an index value may be generated for the CAM storage location that matches a comparand value. Further, a search result may be communicated back to an NPU 902 by way of control and data signals 908. It is noted that in a conventional case, a comparand register set 916 location corresponding to a matching comparand value may then be free for use again in a system.

If none of the values stored in a CAM array 912 matches a comparand value, such an operation may be considered a search "miss". In this case, a comparand value stored at the specified comparand register set 916 location may be retained for later use. In particular, such a comparand value may be used in a "learn" operation. A learn operation provides a way for the CAM to "learn" the comparand value for a previously missed search operation. Thus, the next time the same comparand value is applied, a search hit may result.

A conventional CAM learn operation will now be described in more detail. To perform a learn operation, an NPU 902 may provide to CAM blocks 904 a location within a comparand register set 916 that contains the comparand value to be "learned". The comparand value stored at this location can then be written into a CAM array 912 at a free or otherwise designated storage location. In this way, the CAM has "learned" the comparand value from a missed search. Associated data for such a comparand value may be written to, or otherwise made available, at some location indexed by a given designated location.

In a conventional learn operation, such as that described above, a network processing unit (NPU) and/or system software or firmware controlling such operations, may have to keep track of the values stored in the comparand register set 916. For example, to perform a learn operation, a system may keep track of which comparand register set 916 locations contain comparand values for a missed search operations. Thus, in performing a learn operation, an NPU 902 may initially issue a search based on a register within a register set 916. When the search indicates a "miss," an NPU 902 recalls the register used in an initial search, and orders a learn operation based upon the same register.

Thus, a conventional approach may require an NPU 902 to access a CAM block (904-1 and 904-2) at least twice in an overall learn operation. One access issues an initial search operation. A second access issues a corresponding learn operation when the initial search gives a miss result. Further, an NPU 902 may have to track which register stores a comparand value within a given CAM block (904-1 and 904-2).

Because reductions in the number of times devices may access one another can increase the speed and efficiency of a system, it would be desirable to arrive at some way of reducing accesses between an NPU and a CAM blocks, or the like.

It is also noted that conventional approaches may result in constraints on when a learn operation may be performed. In particular, if all locations of a CMPR set 916 store comparand values that are in use, it may not be possible to issue a learn command.

Thus, it would be desirable to arrive at some way of providing more flexibility in how comparand storage registers are utilized in CAM system.

SUMMARY OF THE INVENTION

According to the present invention, a content addressable memory (CAM) system may include a free index list and a busy index list. A free index list may include locations for storing index values that correspond to comparand values for use in search operations. A busy index list may include locations for storing index values that correspond to comparand values for use in non-search operations.

According to one aspect of the embodiments, a free index list may include registers that store indexes to comparand registers.

According to another aspect of the embodiments, a busy index list may also include registers that store indexes to the comparand registers.

According to another aspect of the embodiments, a CAM system may further include head and tail pointers for a free index list that indicates the start and end of valid entries in the free index list. Head and tail pointers may also be provided for a busy index list.

According to another aspect of the embodiments, a CAM system may further include a descriptor command list. A descriptor command list may store values associated with commands issued to CAM cells. Each location of a descriptor command list may include an index field that stores an index value for a comparand, as well as a valid field that stores a valid indication for the descriptor command list location.

According to another aspect of the embodiments, a CAM system may further include at least one CAM block. A CAM block may include at least one array of CAM cells and comparand registers for storing comparand values. Index values may correspond to comparand register locations.

The present invention may also include various methods for monitoring comparand index values. Such methods may be associated with particular content addressable memory (CAM) operations, such as a restart operation, search operation, free index operation, and learn operation.

According to one aspect of the embodiments, a method may include assigning a comparand index value to a free comparand list. A comparand corresponding to the comparand index value may then be compared with a plurality of CAM locations. If the comparand matches a CAM location, the comparand index value may be removed from a free comparand list. If the comparand does not match a CAM location, the comparand index value may be assigned to a busy comparand list.

According to another aspect of the embodiments, each search command may be associated with a descriptor. Prior to comparing the comparand to CAM locations, a valid indication may be set to a valid state within the descriptor associated with the search command.

According to another aspect of the embodiments, after removing a comparand index value, a valid indication may be set to an invalid state within a descriptor associated with a search command.

According to the present invention, a method according to the present invention may alternately include initializing a list for free comparand index values and a list for busy comparand index values. Such a method may also include initializing pointers to the lists for free and busy comparand index values.

According to one aspect of the embodiments, initializing the pointers may include initializing head and tail pointers that indicate the start and end of the free comparand index list, respectively, and/or busy comparand index list, respectively.

According to another aspect of the embodiments, a method may further include freeing up at least one busy comparand index value when there are no more free comparand index values.

According to another aspect of the embodiments, when at least one busy comparand index value is made free in response to no more free comparand index values, a descriptor command associated with the comparand index value may be set to an invalid state.

According to the present invention, a method according to the present invention may alternately include executing a learn operation with a comparand value identified by a comparand index value. The comparand index value may be stored in a busy comparand index list. The comparand index value may then be moved from the busy comparand index list to a free comparand index list.

According to one aspect of the embodiments, the learn operation may be executed according to a descriptor. If the descriptor is valid, a learn operation may be executed and a comparand index value moved from a busy list to a free list, as noted above. In addition, the descriptor may be changed from a valid indication to an invalid indication.

According to one aspect of the embodiments, the learn operation may be executed according to a descriptor. If the descriptor is not valid, a search operation may be performed with a comparand value. A comparand index value associated with the comparand value may then be assigned to the busy comparand list. A learn operation may then be executed and a comparand index value moved from a busy list to a free list, as noted above.

DETAILED DESCRIPTION OF THE EMBODIMENTS

Various embodiments will now be described in conjunction with a number of diagrams. The embodiments set forth devices and methods for internally monitoring the status of a CAM comparand register such that the current state is always known. This may reduce the burden on a controlling network processor unit (NPU).

Figure 1A:
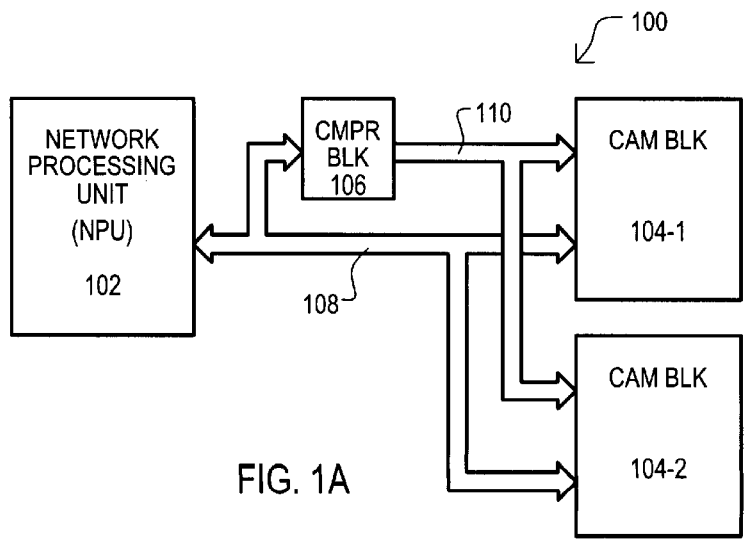
FIGS. 1A, 1B and 1C are block diagrams showing a CAM system according to a first embodiment.

Referring to FIG. 1A, a first embodiment of a CAM system is set forth and designated by the general reference character 100. A first embodiment 100 may comprise various system blocks, including a network processor unit (NPU) 102, one or more CAM blocks 104-1 and 104-2, a comparand register (CMPR) index block 106, CAM control and data signal lines 108, and CMPR index signal lines 110.

According to the present invention, the various blocks of a CAM system, such as that set forth in FIG. 1A, may be formed on a single substrate. Alternatively, one or more blocks may be formed on a separate substrate than another.

A network processor unit 102 may include circuits and/or devices that direct a processing of input and output values, and may control CAM blocks 104 by way of CAM control and data signals 108. The particular CAM system shown in FIG. 1A includes two CAM blocks 104-1 and 104-2, but such a system may in general contain any number of such CAM blocks.

As shown in FIG. 1A, a first embodiment may also include a CMPR index block 106 that may take CAM control and data signal on lines 108 as an inputs, and generate CMPR index signal on lines 110 as an output. CAM blocks 104-1 and 104-2 may receive, as inputs, CMPR index signal on lines 110. CMPR index signals may select a comparand register location for a search and/or other operations.

Figure 1B:
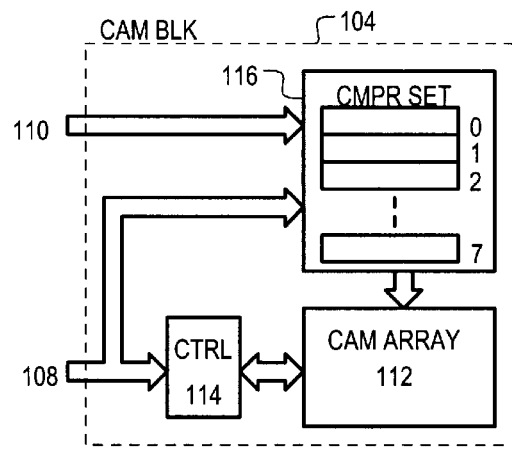

Referring now to FIG. 1B, a CAM block 104 (such as that shown as 104-1 and 104-2 in FIG. 1A) is shown in more detail, and may include a CAM array 112, CAM control circuit 114, and a comparand register (CMPR) set 116.

A CAM array 112 may contain any number of CAM storage cells that can store data for comparison to a key or comparand value. Such CAM storage cells may also be read from and/or written to. A CAM array 112 may also support a search function, where a search key or "comparand" can be compared against data stored in any number of CAM entries. If the data in any CAM entry matches the comparand value, then a search hit may be indicated. Otherwise, a search miss may be indicated. A CAM entry may include a number of CAM cells. Such CAM cells may be common to a row in a CAM array. CAM cells may be binary CAM cells and/or ternary CAM cells. As is well known, CAM cells may be based on static storage units (such as static random access memory (SRAM)-type circuits) and/or dynamic based storage units (such as dynamic random access memory (DRAM)-type circuits).

CAM control circuits 114 can take CAM control and data signals 108 as inputs and generate signals that may control the operation of a CAM array 112.

A CMPR set 116 may include a number of storage locations that may be used to store comparand values used for search operations. In the particular example of FIG. 1B, a CMPR set 116 is shown to include eight storage locations. Comparand values may be loaded into a CMPR set 116 by CAM control and data signals 108. Such comparand values may then be stored at locations determined by CMPR index signals 110. Referring black to FIG. 1A, these CMPR index signals 110 may be generated by a CMPR index block 106.

Figure 1C:
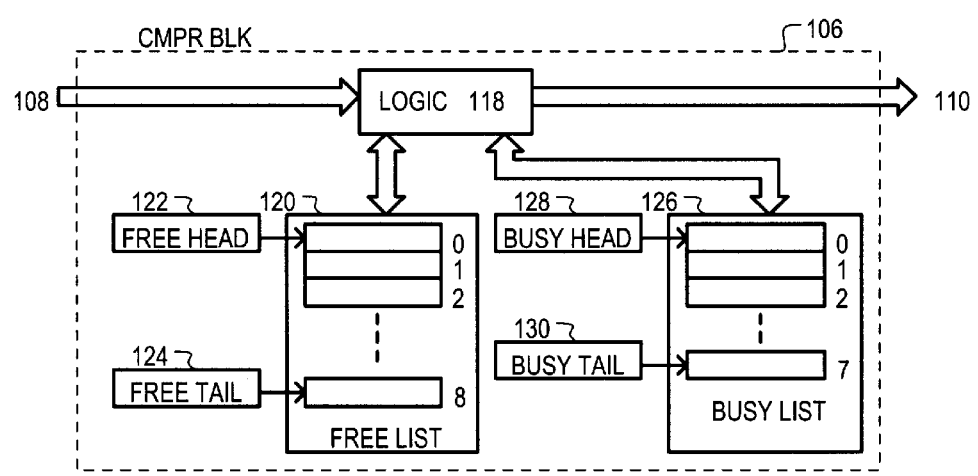

FIG. 1C shows an example of a CMPR index block 106 according to one embodiment. A CMPR index block 106 may include CMPR index logic circuits 118, a free comparand register set (FREE_CMPR_LIST) 120, a free comparand register head (FREE_CMPR.HEAD) register 122, and a free comparand register tail (FREE_CMPR.TAIL) register 124. A CMPR index block 106 may also include a busy comparand register set (BUSY_CMPR_LIST) 126, a busy comparand register head (BUSY_CMPR.HEAD) register 128, and a busy comparand register tail (BUSY_CMPR.TAIL) register 130.

CMPR index logic circuits 118 may control the insertion and/or retrieval of values in a FREE_CMPR_LIST register set 120 or a BUSY_CMPR_LIST register set 126, and may also update pointers such as a FREE_CMPR.HEAD 122, a FREE_CMPR.TAIL register 124, a BUSY_CMPR.HEAD register 128, or a BUSY_CMPR.TAIL register 1130.

A FREE_CMPR_LIST register set 120 may be connected to CMPR index logic circuits 118 and may be used to store a list of comparand register set locations (such as those shown as 116 in FIG. 1B) that are free to be used for search operations. A FREE_CMPR_LIST register set 120 is shown in FIG. 1C to include nine storage locations, although this is but one example. Preferably, the number of storage locations in a FREE_CMPR_LIST register set 120 may be at least one more than the number of comparand register set 116 storage locations, but other configurations may be possible.

A list of free CMPR locations stored in a FREE_CMPR_LIST register set 120 may be dynamic. In other words, a range of register locations within a FREE_CMPR_LIST register set 120 that contain a list of free CMPR set 116 locations may be changed as a CAM system operates. A FREE_CMPR.HEAD register 122 may contain a pointer that indicates which location in a FREE_CMPR_LIST register set 120 contains the first value in a list. A FREE_CMPR.TAIL register 124 may contain a pointer that indicates which location in a FREE_CMPR_LIST register set 120 contains a last value in this list.

Since a FREE_CMPR.HEAD register 122 can always point to the start of a list of free CMPR index values, it can be used to automatically assign a comparand register index value when a search operation is to be performed by a CAM. This may remove the burden of tracking and assigning which CMPR entry to use for search operations from the NPU.

A FREE_CMPR.TAIL register 124 in conjunction with a FREE_CMPR.HEAD register 122 may also be used to determine when there are no more free CMPR set 116 locations available to use for a search operation. In response to such an indication, a system may take predetermined actions, such as "free-up" register operations, as will be described in more detail below.

At the same time a FREE_CMPR_LIST register set 120 may indicate available register locations, a BUSY_CMPR_LIST register set 126 may indicate registers that may be reserved for current or future use.

In FIG. 1C, a BUSY_CMPR_LIST register set 126 may be connected to CMPR index logic circuits 118, and may be used to store a list of comparand register set 116 locations that are "busy." Such busy comparand register locations may store comparand values that have resulted in a search miss. The particular BUSY_CMPR_LIST register set 126 of example FIG. 1C includes eight storage locations, although this is but one example. Preferably, the number of storage locations in a BUSY_CMPR_LIST register set 126 may be the same as the number of CMPR set 116 storage locations, although other configurations may be possible.

Like the FREE_CMPR_LIST register set 120, a list of busy CMPR locations stored in the BUSY_CMPR_LIST register set 126 may be dynamic. In other words, a range of register locations within a BUSY_CMPR_LIST register set 126 that contain a list of busy CMPR set 116 locations may be changed as a CAM system operates. A BUSY_

CMPR.HEAD register 128 may contain a pointer that indicates which location in a BUSY_CMPR_LIST register set 126 contains the first value in this list. A BUSY_CMPR.TAIL register 130 may contain a pointer that indicates which location in a BUSY_CMPR_LIST register set 126 contains a last value in this list.

Since a BUSY_CMPR.HEAD register 128 always points to the start of a list of "busy" CMPR entries, it can be used to automatically assign a comparand register index value when a learn operation is performed by the CAM. This may remove the burden of tracking and assigning which CMPR entry to use for learn operations from the NPU. A BUSY_CMPR.TAIL register 130 may be used to determine if there are no more CMPR set 116 entries that need to be learned.

A FREE_CMPR_LIST register set 120 and a BUSY_CMPR_LIST register set 126, along with the accompanying head and tail registers can therefore provide a means to track the status of a comparand register set 116, and allow a CMPR index value to be assigned automatically. This may remove the burden of tracking these locations from the NPU that controls that CAM, and thereby reduce the load on system software. In this way, higher CAM performance may be achieved.

While the present invention may be represented by a CAM based system, the invention may also include one or more methods. Accordingly, a second embodiment of the invention as a method will now be described.

Figure 2A:
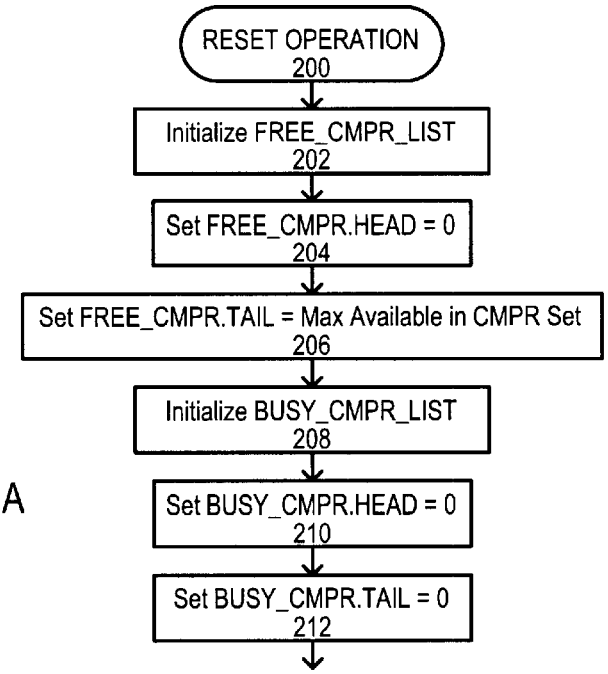
FIGS. 2A, 2B, 2C and 2D are block diagrams showing a method of monitoring comparand registers in a CAM system during various operations, according to a second embodiment.
Figure 2B:
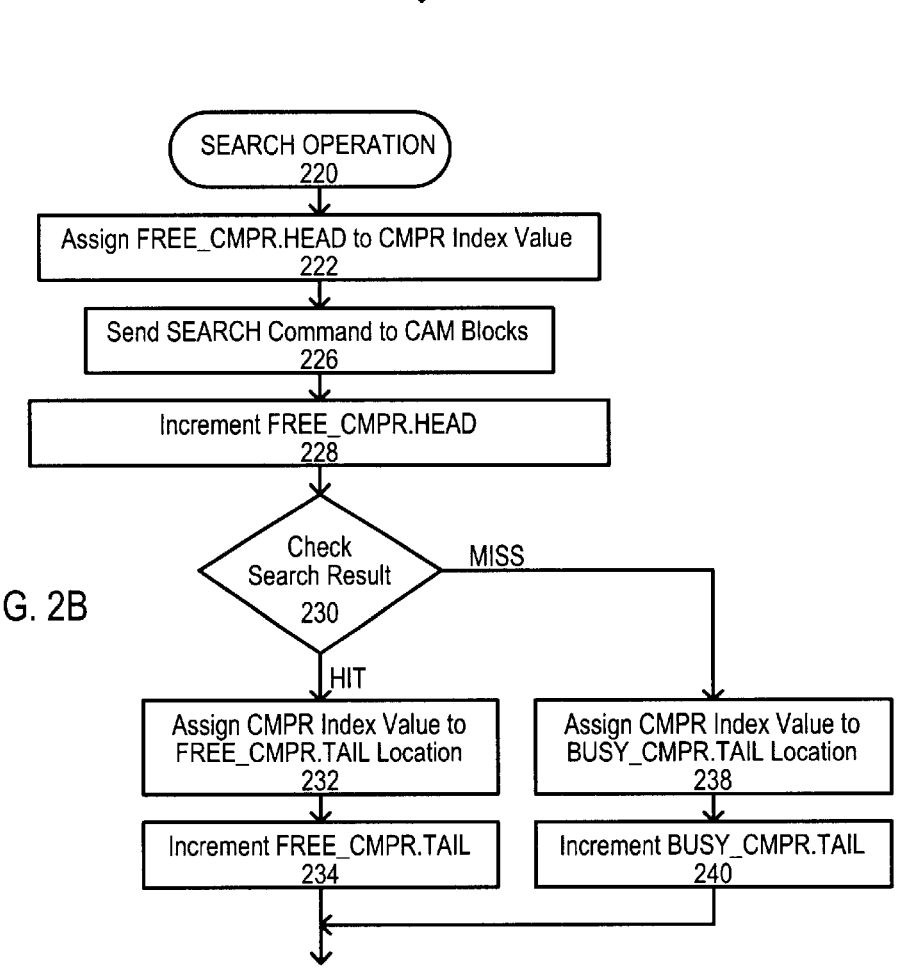
Figure 2C:
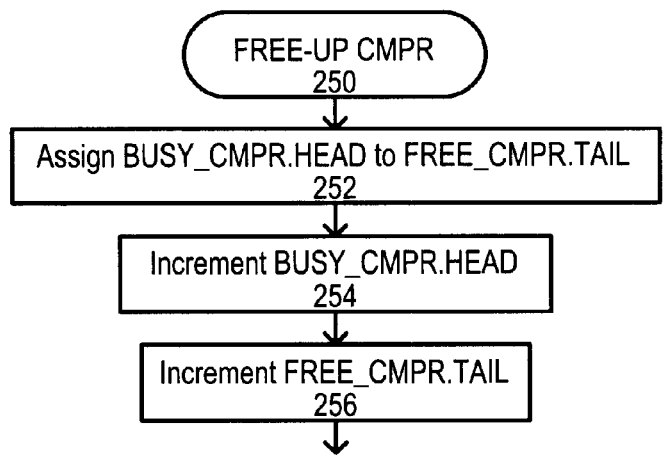
Figure 2D:
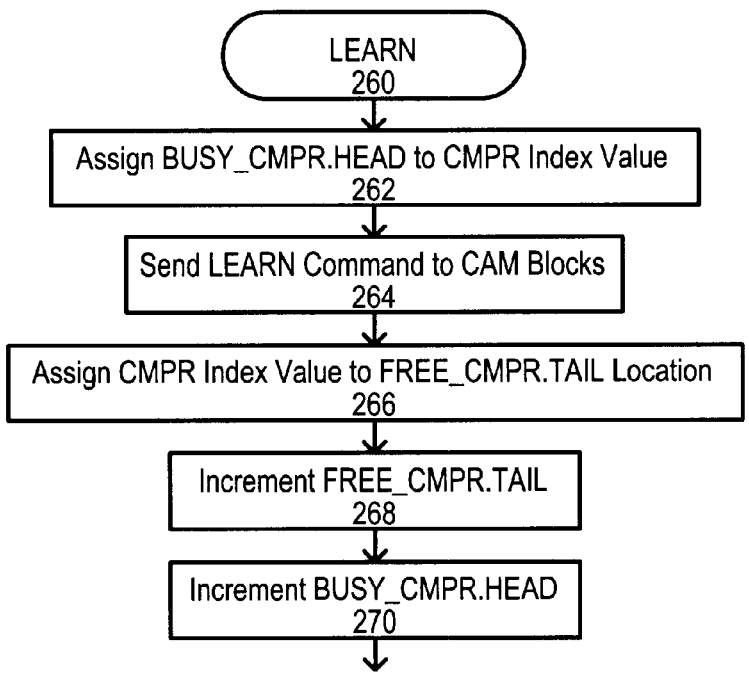

According to a second embodiment, a method may include one or more of the following operations: a reset operation, a search operation, free-up register operation, and a learn operation. Particular examples of such operations are shown in FIGS. 2A–2D in a series of flow diagrams. FIG. 2A shows one example of a reset operation. FIG. 2B shows one example of a search operation. FIG. 2C shows one example of a free register operation. FIG. 2D shows one example of a learn operation.

FIGS. 3A–3G set forth a number of bock diagrams illustrating the states of various registers during and after the operations described in FIGS. 2A–2D. Registers depicted in FIGS. 3A–3G can correspond to registers described in the first embodiment in FIG. 1C. To that extent, like constituents will be referred to by the same reference character, but with the first character being a 3 instead of a 1. Thus, FIGS. 3A–3G include a FREE_CMPR_LIST register set 320, a FREE_CMPR.HEAD register 322, a FREE_CMPRI TAIL register 324, a BUSY_CMPR_LIST register set 326, a BUSY_CMPR.HEAD register 328, and a BUSY_CMPR.TAIL register 330. As shown in FIGS. 3A–3G, a FREE_CMPR_LIST register set 320 has nine storage locations designated by the characters 320-0–320-8, and a BUSY_CMPR_LIST register set 326 has eight storage locations designated by the characters 326-0–320-7, although this is but one example and other configurations are possible.

Figure 3A:
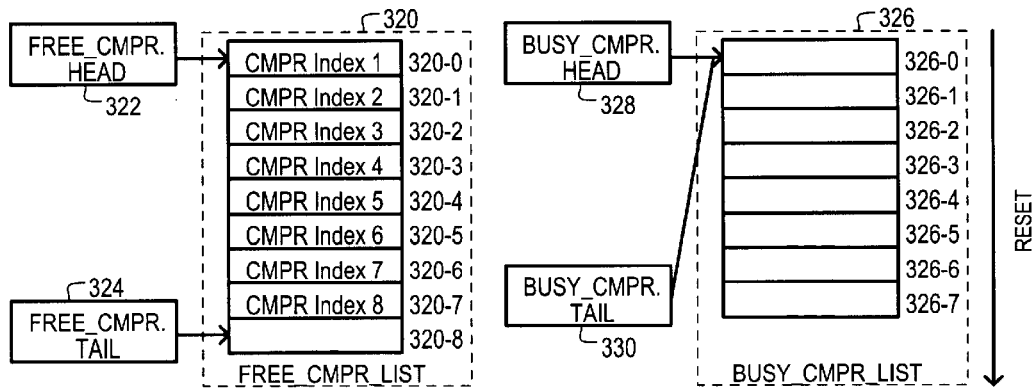
FIGS. 3A, 3B, 3C, 3D, 3E, 3F and 3G are block diagrams showing the states of various registers at different steps of a method according to the second embodiment.

Referring to FIG. 2A, a reset operation 200 according to a second embodiment will now described. A reset operation 200 may be performed when a CAM system is initialized, such as after power up for example. A reset operation 200 may include the steps of initializing FREE_CMPR_LIST 202, setting FREE_CMPR.HEAD 204, setting FREE_CMPR.TAIL 206, initializing BUSY_CMPR_LIST 208, setting BUSY_CMPR.HEAD 210, and setting BUSY_CMPR.TAIL 212. The state of these registers after a reset operation is shown in FIG. 3A, and will now be described in more detail.

An initialize FREE_CMPR_LIST step 202 may include loading a FREE_CMPR_LIST register set 320 with index values (e.g., pointers) to possible comparand register locations. Referring to FIG. 3A, a FREE_CMPR_LIST register set 320 is shown to contain eight CMPR index values represented by "CMPR Index 1" through "CMPR Index 8".

A set FREE_CMPR.HEAD step 204 may include loading a FREE_CMPR.HEAD register 322 with an index value or "pointer" that indicates which FREE_CMPR_LIST register set 320 location contains the first entry in a list of free CMPR index values. In this case, a FREE_CMPR.HEAD register 322 may be set to "0." In other words, a FREE_CMPR.HEAD register 322 may "point" to FREE_CMPR_LIST register location 320-0. This is represented in FIG. 3A by an arrow drawn from a FREE_CMPR.HEAD register 322 to FREE_CMPR_LIST register location 320-0.

A set FREE_CMPR.TAIL step 206 may include loading a FREE_CMPR.TAIL register 324 with an index value or "pointer" that indicates which FREE_CMPR_LIST register set 320 location is at the end of a list of free CMPR index values. Such a pointer may also represent the first location within a FREE_CMPR_LIST register set 320 into which a new CMPR index value can be loaded. Thus, a FREE_CMPR.TAIL register 324 can point to the first FREE_CMPR_LIST register set 320 location after a stored list of free CMPR index values. In the example of FIG. 3A, a FREE_CMPR.TAIL register 324 may be set to "8" and thus "point" to FREE_CMPR_LIST register location 320-8. This is represented in FIG. 3A by an arrow drawn from a FREE_CMPR.TAIL register 324 to FREE_CMPR_LIST register location 320-8.

An initialize BUSY_CMPR_LIST step 208 may include initializing a BUSY_CMPR_LIST register set 326 for use in a system. This can enable a BUSY_CMPR_LIST register set 326 to store a list of busy CMPR index values. That is, pointers to registers storing comparand values that may be used in further operations, such as learn operations, as one example. Since a reset operation 200 can generally done before any search operations have been performed, a BUSY_CMPR_LIST register set 326 may be initialized to arbitrary values. Referring to FIG. 3A, these arbitrary values are represented by dashes in BUSY_CMPR_LIST register locations 326-0 to 326-7.

A set BUSY_CMPR.HEAD step 210 may include loading a BUSY_CMPR.HEAD register 328 with an index value or "pointer" that indicates a BUSY_CMPR_LIST register set 326 location that contains a first entry in a list of busy CMPR index values. In the example of FIG. 3A, a BUSY_CMPR.HEAD register 328 may be set to "0", or in other words "point" to BUSY_CMPR_LIST register location 326-0. This is represented in FIG. 3A by an arrow drawn from a BUSY_CMPR.HEAD register 328 to BUSY_CMPR_LIST register location 326-0.

A set BUSY_CMPR.TAIL step 212 may include loading a BUSY_CMPR.TAIL register 330 with an index value or "pointer" that indicates which BUSY_CMPR_LIST register set 326 location is at the end of a list of busy CMPR index values. Like step 206, step 212 may include loading a register with a pointer to a location can be a first free location in a BUSY_CMPR_LIST register set 326 into which a new busy CMPR index value can be loaded. In other words, a BUSY_CMPR.TAIL register 330 can point to the first BUSY_CMPR_LIST register set 326 location after a stored list of busy CMPR index values. In the example of FIG. 3A, upon initialization a system has no busy comparand values and/or has yet to receive comparand values. As a result, a BUSY_CMPR.TAIL register 330 may be set to the same value as a BUSY_CMPR.HEAD register 328.

This is represented in FIG. 3A by an arrow drawn from a BUSY_CMPR.TAIL register 330 to BUSY_CMPR_LIST register location 326-0.

In this way, a reset operation 200 according to a second embodiment may initialize a first register to track available comparand storage locations and a second register to track comparand storage locations that are, or may be in use by a system. Of course, the sequence of steps 202 through 212 may vary with no change in the end result. Accordingly, the particular order set forth in FIG. 2A should not necessarily be construed as limiting the invention thereto.

It is also noted that while the initialization of a list of free CMPR index values described in steps 202–206 and illustrated in FIG. 3A results in list of free CMPR values that starts at FREE_CMPR_LIST register set location 320-0 and ends at FREE_CMPR_LIST register set location 320-7, the list may be initialized in many other ways. As but one example, a FREE_CMPR.HEAD register 322 could be initialized to point to FREE_CMPR_LIST register set location 320-3 and a FREE_CMPR.TAIL register 324 could be initialized to point to FREE_CMPR_LIST register set location 320-2, resulting in a list of free CMPR values that starts at FREE_CMPR_LIST register set location 320-3 and wraps back around to FREE_CMPR_LIST register set location 320-1 (i.e., a circular buffer arrangement).

Likewise, while the initialization of a list of busy CMPR index values as described in steps 208 through 212 and illustrated in FIG. 3A is shown to begin at a particular location, such a list could also be initialized to start at any other BUSY_CMPR_LIST register set locations.

Referring now to FIG. 2B, a search operation 220 according to a second embodiment will now be described.

A search operation 220 may include the step of assigning FREE_CMPR.HEAD to a CMPR index value 222. Such a step may include storing a value in a FREE_CMPR.HEAD register that points to a comparand value. Such a comparand value may be that which will be applied to one or more CAM blocks in search of a match or no match result.

A search operation 220 may then send a search command to one or more CAM blocks 226. A step 226 may include applying a comparand value to multiple CAM blocks to generate a result. As noted above, a result may include a "hit" or "miss."

Having issued a search command, a search operation may then increment a FREE_CMPR.HEAD register 228. Such a step may include loading or changing a value stored in FREE_CMPR.HEAD register 228 to point to a "next" location in a FREE_CMPR_LIST register set 320.

A search operation 220 may then proceed with a step of checking a search result 230. "Free" or "busy" registers may then be updated according to whether or, not a search yields a hit or a miss.

In the particular example of FIG. 2B, in the event of a search hit, free index registers are updated. More particularly, a free index register value may be assigned to a free tail location (step 232), and a free tail register may then be incremented (step 234). This operation will be described in more detail with reference to FIGS. 3A to 3C.

It will first be assumed that free and busy comparand registers are in the state shown in FIG. 3A (e.g., a reset operation 200 has been performed).

As noted in FIG. 2B, a first step in a search operation 220 may include assigning FREE_CMPR.HEAD to the CMPR index value 222. In FIG. 3A this is represented by CMPR Index 1 being stored at location 320-0. Thus, it is understood that a comparand pointed to by index 320-0 may be used in a search operation.

Referring now to FIG. 2B, using a comparand index value assigned in step 222, a search command may then be sent to CAM blocks, step 226. Such a step is represented in FIG. 3B by arrow 322.

Once a search command is sent to CAM blocks 226, free comparand registers may be updated by incrementing a FREE_CMPR.HEAD register (step 228). Such a step is shown in FIG. 3B by a FREE_CMPR.HEAD register 322 pointing to FREE_CMPR_LIST register set location 320-1 instead of register set location 320-0.

Once a search command has been completed, a result of the search may be indicated by the CAM blocks as either a hit or a miss. Such a result may be checked (step 230 in FIG. 2B).

Figure 3B:
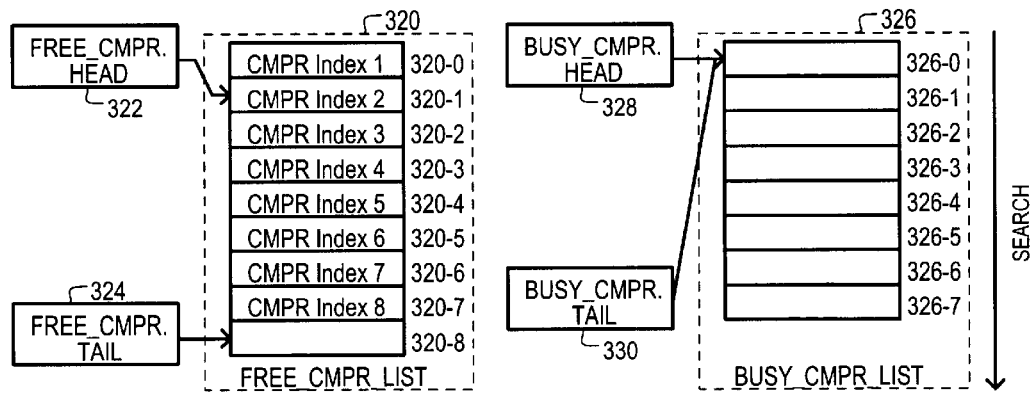
Figure 3C:
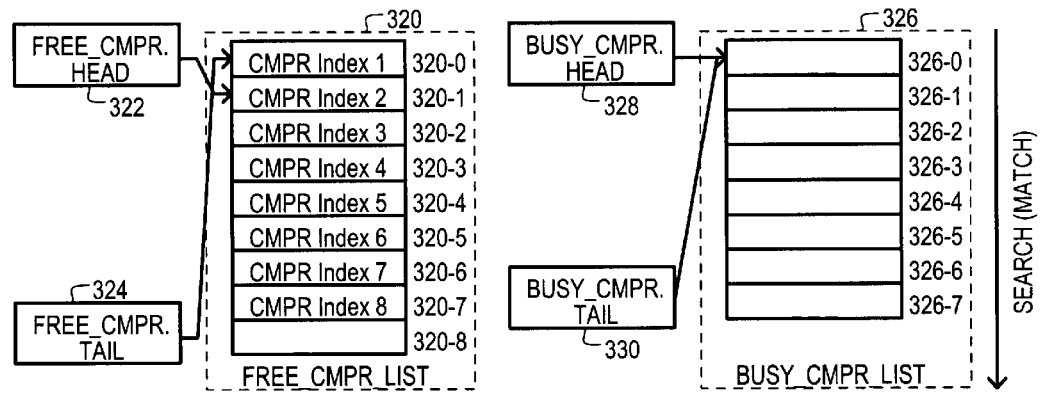

FIGS. 3A to 3C describe a hit case, thus it is assumed that step 230 indicates a hit.

In the event of a hit, a comparand index value used in a search (in this case location 320-0) may be free for use again in a subsequent search. Thus, as shown in FIG. 2B, free comparand registers may be updated using the steps: assign CMPR index to FREE_CMPR.TAIL location 232, and increment FREE_CMPR.TAIL 234. Such steps are represented in FIG. 3C. A comparand index value used for a previous search, "CMPR Index 1" in this example, may now be stored at FREE_CMPR_LIST register set location 320-8, which was the location pointed to by a FREE_CMPR.TAIL register 324 prir to processing the search hit result (as shown in FIG. 3B). Further, a FREE_CMPR.TAIL register 324 has been incremented (step 234 in FIG. 2B). Because FIGS. 3A to 3C illustrate a circular set of registers, a FREE_CMPR.TAIL register 324 now points to FREE_CMPR_LIST register set location 320-0, having "wrapped around" from the last register location.

In this way, in the event of a search hit, free register values may be updated in the event of a search hit to make the register used in a search available for another search.

Referring back to FIG. 2B, recall that in the event of a search miss, busy index registers may be updated. More particularly, an index register value may be assigned to a busy tail location (step 238), and a busy tail register may then be incremented (step 240). This operation will be described in more detail with reference to FIGS. 3B and 3D.

If a search result 230 indicates that a search was a "miss", a comparand index value may be retained for future use. As but one example, such a value may be used in a "learn" operation. In the particular example of FIG. 2B, busy comparand registers may be updated with the steps of: assigning CMPR index to BUSY_CMPR.TAIL location 238, and incrementing a BUSY_CMPR.TAIL 240.

It will first be assumed that steps 220 to 228 have been performed as noted above. Thus, prior to checking the search result 230, free and busy comparand registers are in the state shown in FIG. 3B.

Figure 3D:
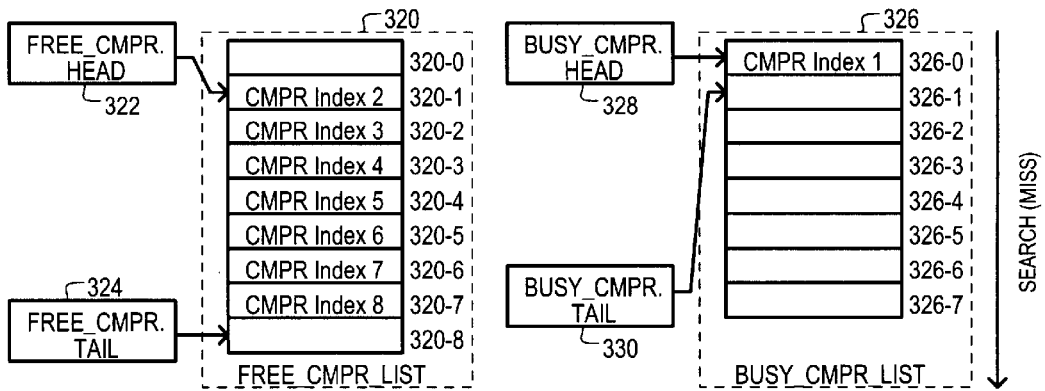

However, unlike the previous example, a result check (step 230) can indicate a search miss. Thus, a search index may be assigned to a busy register tail value (step 238). Such a step is represented in FIG. 3D by index CMPR Index 1 being stored at the location pointed by tail register 330 prior to a search result (location 326-0).

Further, a busy tail register may be incremented (step 234). Such a step is represented in FIG. 3D by an arrow pointing from a register 330 to location 326-1. In this way, a new register location may be ready for another comparand value that needs to be retained for use on another operation (e.g., a learn operation).

In this way, in the event of a search hit, busy register values may be updated to retain the location of a comparand value for use in a subsequent operation,l such as a learn operation.

Thus, a method of monitoring comparand registers during a search operation 220 according to a second embodiment may dynamically update lists of free and busy comparand index values to maintain state information of comparand register locations for a system. Accordingly, free register locations may be readily known for search operation, while busy register locations may be readily known for operations on retained comparand values, such as learn operation. In this way, the performance of a CAM system may be increased by reducing the burden of tracking comparand values by a network processing unit.

Referring now to FIG. 2C, a free-up register operation according to a second embodiment will now be described.

One example of a free-up register operation is shown in FIG. 2C as a free CMPR operation 250. A free CMPR operation 250 may free up an entry in a list of free comparand index values if all of the values are currently being used. The particular operation of FIG. 2C can include the steps of assigning a BUSY_CMPR.HEAD to FREE_CMPR.TAIL 252, incrementing a BUSY_CMPR.HEAD 254, and incrementing FREE_CMPR.TAIL 256.

One example of a free CMPR operation 250 will now be described with reference to FIGS. 3E and 3F.

Figure 3E:
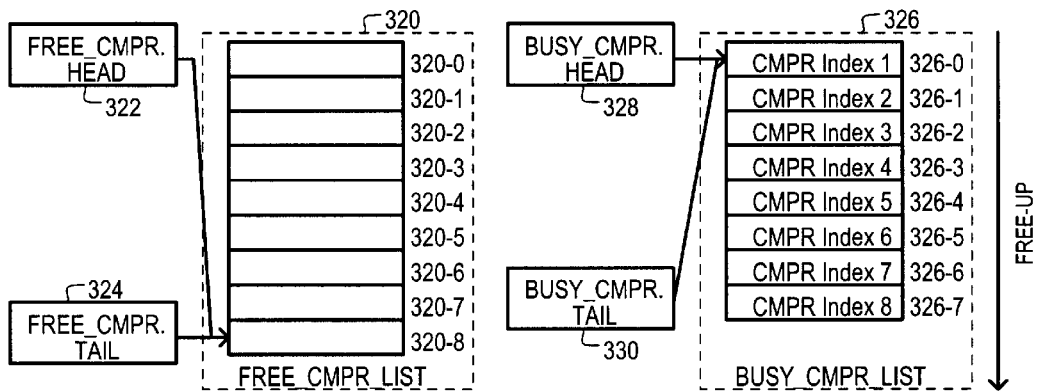
Figure 3F:
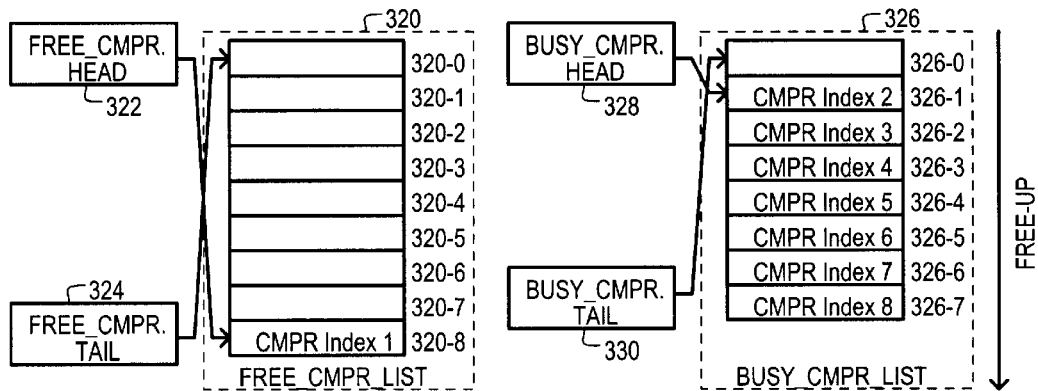

FIG. 3E shows an example of free and busy comparand registers when there are no more available entries in a FREE_CMPR_LIST register set 320. Such a condition may occur when a number of search operations resulting in misses have been performed, but corresponding learn operations have not yet been executed. The state is represented in FIG. 3E by a FREE_CMPR.HEAD register 322 and a FREE_CMPR.TAIL register 324 both pointing to the same location of a FREE_CMPR_LIST register set 320. Further, as also shown in FIG. 3E, all of the comparand index values are in a BUSY_CMPR_LIST register set 326.

Referring back to FIG. 2C, a free CMPR operation 250 may include assigning a BUSY_CMPR.HEAD to FREE_CMPR.TAIL, step 252. Such a step is represented in FIG. 3F by a comparand index value "CMPR Index 1" that had been stored in BUSY_CMPR_LIST register set location 326-0, now being stored at a FREE_CMPR_LIST register set location 320-8.

A BUSY_CMPR.HEAD may then be incremented (step 254). This can adjust the beginning location of a list of busy comparand index values, since a comparand index value with the busy register has since been freed up and moved to a list of free comparand index values. Such a step is represented in FIG. 3F by a BUSY_CMPR.HEAD register 328 now pointing to BUSY_CMPR_LIST register set location 326-1.

Figure 3G:
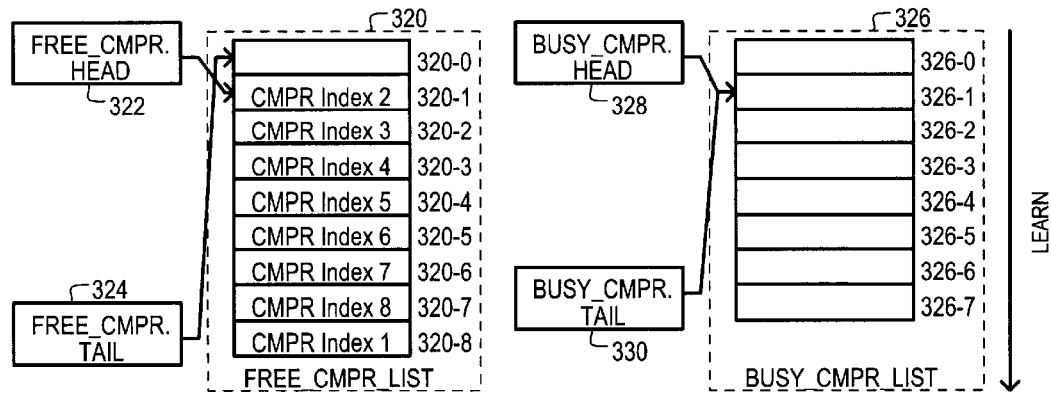

A free-up CMPR operation 250 may further include incrementing a FREE_CMPR.TAIL (step 256). This can mark a new end to a list of free comparand index values since a new index value has been moved into the free comparand index list. Such a step is represented in FIG. 3G by a FREE_CMPR.TAIL register 324 that now points to FREE_CMPR_LIST register set location 320-0.

In this way a free CMPR operation 250 can free up a comparand index value when it has been determined that no more are available to perform a search operation 220. Such an operation may provide flexibility and improve performance by ensuring that a register for a search comparand may always be available or available upon execution of a free CMPR operation 250.

Referring now to FIG. 2D, a learn operation according to a second embodiment will now be described.

Referring now to FIG. 2D, one example of a learn operation 260 is set forth in a flow diagram. A learn operation 260 may include the steps of assigning a busy comparand head value to a CMPR index pointer (step 262), sending a learn command (Step 264), assigning a CMPR index value to a free compare tail pointer (step 266), incrementing a fee compare tail pointer (step 268), and incrementing a busy compare head value (270).

One example of a learn operation will now be described with reference to FIG. 2D in conjunction with FIGS. 3D and 3G.

It will first be assumed that free and busy comparand registers are in the state shown by FIG. 3D. In particular, a comparand corresponding to the CMPR Index 1 is stored at busy comparand register set location 326-0. This indicates the corresponding comparand value has been applied in a search operation and generated a miss result. Consequently, the comparand value is being retained for a learn operation, as an example.

A learn operation 260 may include the step of assigning BUSY_CMPR.HEAD to the CMPR index value (step 262). Such a step is represented in FIG. 3D by busy head register 328 pointing to location 326-0, which stores a first value corresponding to a comparand for use in a learn operation.

A learn operation 260 may then send a learn command (step 264) to CAM blocks, or the like. In the example of FIGS. 3D and 3G, a comparand corresponding to CMPR Index 1 may be used by CAM blocks in a learn operation. As but one example, the corresponding comparand value may be written to a free location in a CAM block according to predetermined criteria.

After a learn command has been sent (step 264), a comparand index value that was being retained for a learn operation may now be free for use in subsequent search operations. In the particular approach illustrated by FIG. 2D, this may include assigning a comparand index value to a FREE_CMPR.TAIL location (step 266). Such a step is shown in FIG. 3G by a compare index value CMPR Index 1 being stored at free register set location 320-8 (a location pointed to by free tail register 324 in FIG. 3D).

A learn operation 260 may further include incrementing a FREE_CMPR.TAIL pointer (step 268). This may indicate a new end to a list of free comparand values. Such a step is represented in FIG. 3G by a FREE_CMPR.TAIL register 324 now pointing to FREE_CMPR_LIST register set location 320-0, having been incremented (and wrapping back around) from FREE_CMPR_LIST register set location 320-8.

A learn operation 260 may continue by incrementing a BUSY_CMPR.HEAD pointer (step 270). Such a step is represented in FIG. 3G by a BUSY_CMPR.HEAD register 330 now pointing to BUSY_CMPR_LIST register set location 326-1, having: previously pointed to BUSY_CMPR_LIST register set location 326-0 prior to performing a learn operation 260 (as shown in FIG. 3D).

It is also noted that in FIG. 3G, a BUSY_CMPR_LIST register set location 326-0 can no longer hold a valid comparand index value, which is represented by the dashes now in that location in FIG. 3G. Although this location no longer contains a valid comparand index value, of course a previous value may not have been removed. Instead, the location of valid data in the list of busy comparand index values is determined by a BUSY_CMPR.HEAD register 328 and a BUSY_CMPR.TAIL register 330.

In this way a learn operation method 260 according to a second embodiment may include updating a list to busy comparand index values to free up locations used in a search operation, and updating free comparand index values to incorporate locations made free from the busy comparand index value. In this way, performance of a CAM system may be increased by reducing the burden of tracking these comparand value locations by a network processing unit.

Having described various systems and method, a third embodiment will now be described with reference to FIGS. 4A to 4D.

Figure 4A:
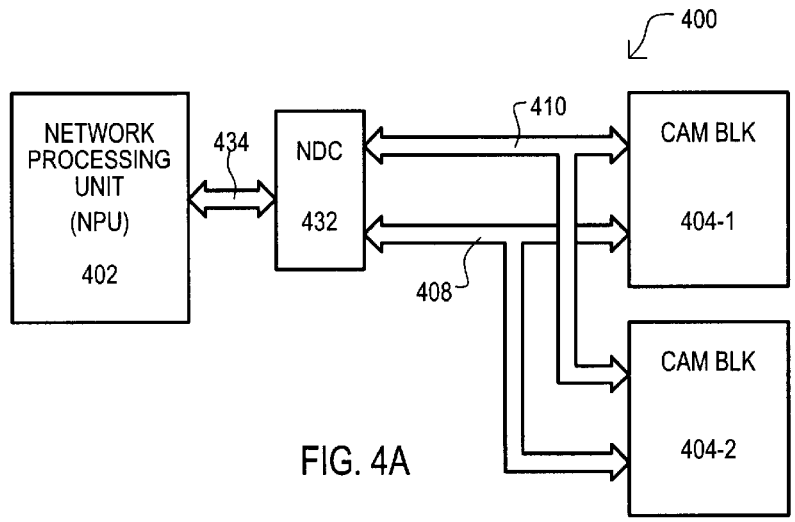
FIGS. 4A, 4B, 4C and 4D are block diagrams showing a CAM system according to a third embodiment.

Referring now to FIG. 4A, a CAM system according to a third embodiment is set forth and designated by the general reference character 400. A third embodiment 400 may include some of the same general constituents as the first embodiment 100. To that extent, like constituents will be referred to by the same reference character, but with the first character being a 4 instead of a 1. Thus, FIG. 4A includes a network processor unit (NPU) 402, two CAM blocks 404-1 and 404-2, CAM control and data signal lines 408, and CMPR index signal lines 410, all of which can function in a similar manner to that previously described for a first embodiment 100.

A third embodiment 400 may also include a network data coprocessing (NDC) block 432 that may interface between an NPU 402 and CAM blocks 404-0 and 404-1. A NDC block 432 can perform some of the processing of network data that an NPU 402 may otherwise perform. A NDC block 432 may receive control and data signals on lines 434 as inputs, and output CAM control and data signal on lines 408, as well as CMPR index signals on lines 410.

Figure 4B:
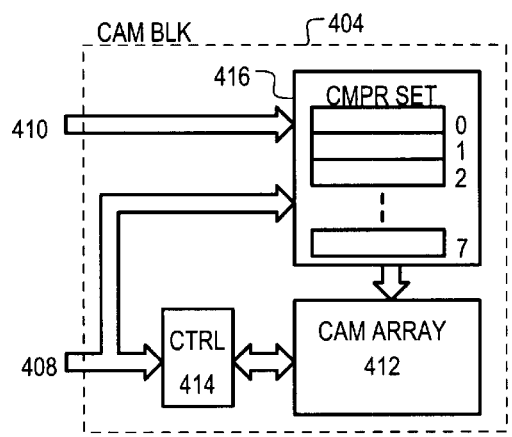

Referring to FIG. 4B, one example of a CAM block 404 is shown. A CAM block 404 can correspond to CAM blocks 404-0 and 404-1 shown in FIG. 4A. A CAM block 404 may include a CAM array 412, CAM control circuits 414, and a comparand register (CMPR) set 416. The function of these blocks can be the same as that previously described for the first embodiment 100.

Figure 4C:
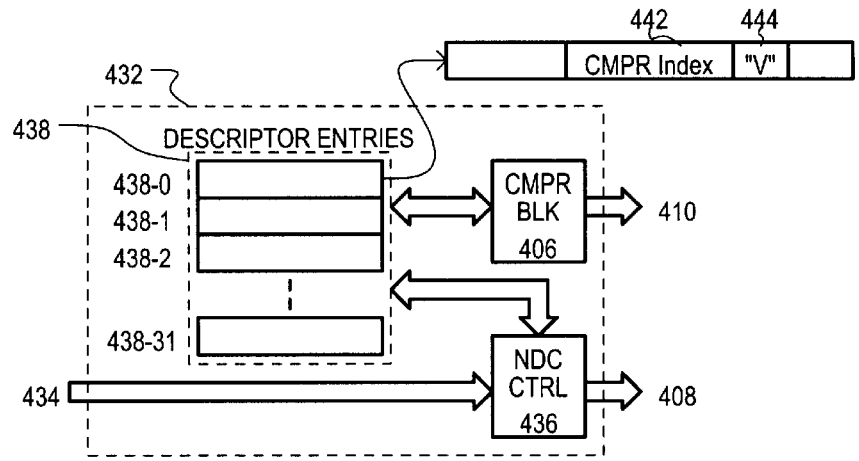

Referring now to FIG. 4C, one example of an NDC block 432 is shown. A NDC block 432 may include a CMPR index block 406, NDC control circuits 436, and a descriptor command register set 438. A descriptor command register set 438 may include a number of descriptor command register entries. In the particular example of FIG. 4C, a descriptor command register set 438 includes 32 entries, 438-0 to 438-31.

Each descriptor command entry 438-0 to 438-31 may contain a number of bits that may store command information and/or data values that can be issued to CAM blocks 404-1 and 404-2. In FIG. 4C, a descriptor command entry (438-0 to 438-31) may include a CMPR index field 442 and a valid field 444.

A CMPR index field 442 may store a CMPR index value for commands sent to CAM blocks 404-0 and 404-1. As but one example, a CMPR index field 442 may include three bits, which can reference eight comparand register locations. Of course, this is but one limited example.

A valid field 444 can indicate whether a CMPR index field 442 contains valid data or not. For example, valid field 444 could include a single bit, and setting bit to "1" may indicate that the CMPR index field 442 contains a valid index value, while setting the bit to "0" may indicate that the CMPR index field 442 does not contain a valid index value.

Referring again to FIG. 4C, NDC control circuits 436 may receive NPU control and data signals on lines 434 as inputs and output CAM control and data signals on lines 408. In addition, NDC control circuits 436 may interface with a descriptor command register set 438.

A CMPR index block 406 may also interface with a descriptor command register set 438 and output CMPR index signals on lines 410 to CAM blocks (such as those shown as 404-1 and 404-2 in FIG. 4A). One example of a CMPR index block 406 is shown in more detail in FIG. 4D.

Figure 4D:
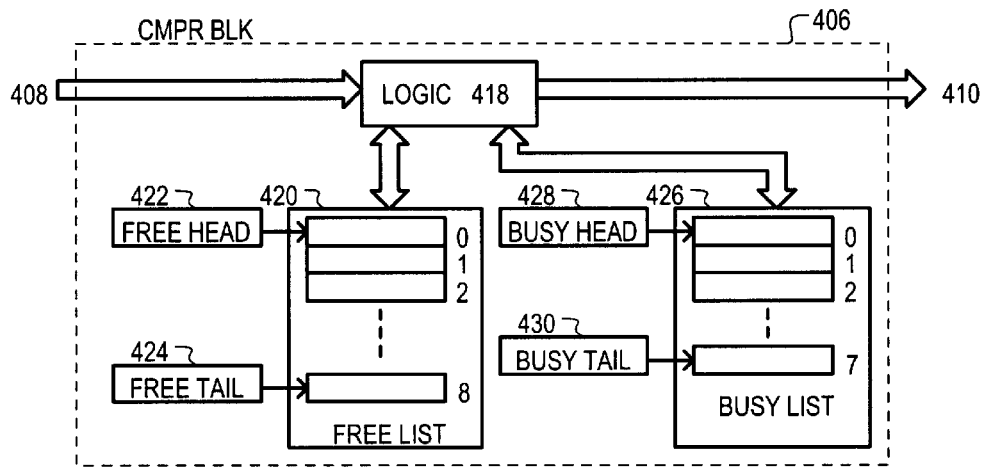

Referring to FIG. 4D, a CMPR index block 406 may include CMPR index logic circuits 418, a free comparand register set 420, a free comparand register head pointer 422, a free comparand register tail pointer 424, a busy comparand register set 426, a busy comparand register head pointer 428, and a busy comparand register tail pointer 430. These blocks may function in a similar manner to that as described for the first embodiment 100 shown in FIG. 1C.

Referring back to FIG. 4A, it is noted that an NDC block 432 could physically exist as a separate device or as part of another device. For example, an NDC block 432 could be part of an NPU device 402, or part of a device containing CAM blocks 404-1 and 404-2.

In this way, a third embodiment 400 may include a particular NDC block 432 that may further remove a burden of tracking comparand register locations and results of search operations from an NPU 402. While a third embodiment 400 has disclosed a particular system arrangement, the invention also includes corresponding methods.

A method of monitoring the status of comparand registers according to a fourth embodiment will now be described with reference to FIGS. 5A–5D and 6A–6H. A fourth embodiment 500 can include many of the same steps as the second embodiment 200 described in FIGS. 2A–2D. To that extent, like constituents will be referred to by the same reference character, but with the first character being a 5 instead of a 2. Thus, FIG. 5A describes a reset operation 500, FIG. 5B describes a search operation 520, and FIG. 5C describes a free-up comparand register location 550. FIG. 5D describes a learn operation 560.

FIGS. 6A–6H set forth a number of diagrams illustrating the states of various registers during and after the operations described in FIGS. 5A–5D. Registers depicted in FIGS. 6A–6H can correspond to registers described as part of the third embodiment 400. To that extent, like constituents will be referred to by the same reference character, but with the first character being a 6 instead of a 4. However, FIGS. 6A–6H also show a descriptor command register set 638. The particular descriptor command register set 638 shown includes 32 descriptor command register set locations 638-0 through 638-31. Further, each descriptor command register entry can include a CMPR index field 642 and a valid bit 644.

Figure 5A:
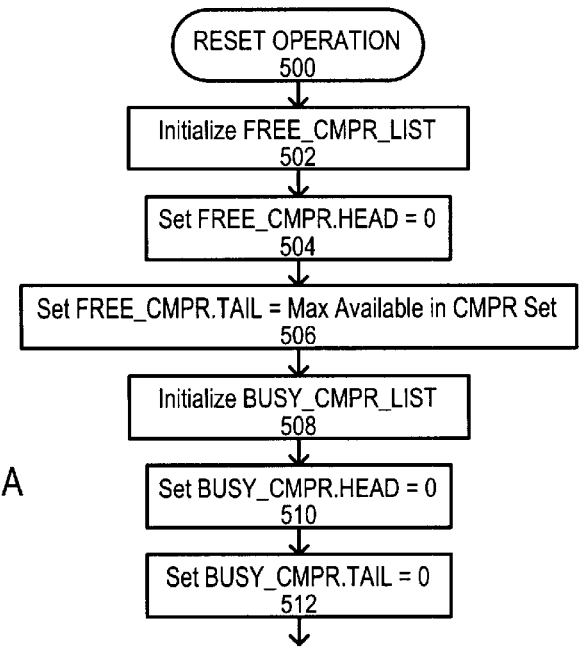
FIGS. 5A, 5B, 5C and 5D are block diagrams showing a method of monitoring comparand registers in a CAM system during various operations, according to a fourth embodiment.
Figure 6A:
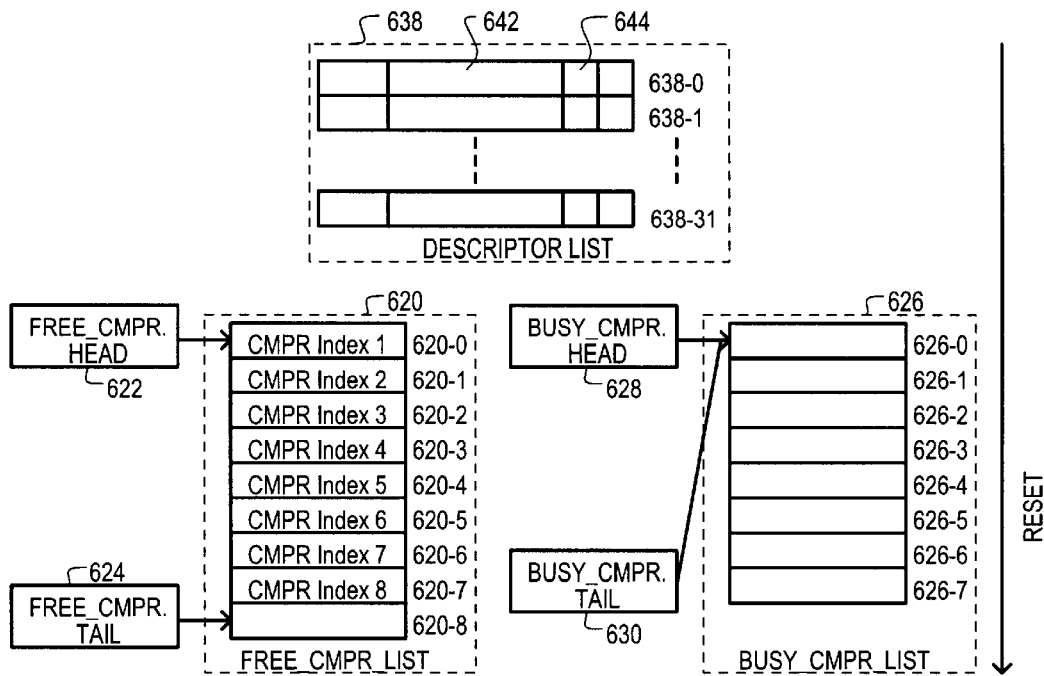
FIGS. 6A, 6B, 6C, 6D, 6E, 6F, 6G and 6H are block diagrams showing the states of various registers at different steps of a method according to the fourth embodiment.

Referring to FIGS. 5A and 6A, a reset operation 500 according to a fourth embodiment will now be described. A reset operation may essentially follow that of a second embodiment 200 shown in FIG. 2A. An example of the state of various registers after a reset operation is shown in FIG. 6A. As shown in FIG. 6A, a FREE_CMPR_LIST register set 620 is shown to include contain eight CMPR index values represented by "CMPR Index 1" through "CMPR Index 8". A FREE_CMPR.HEAD register 622 may now point to FREE_CMPR_LIST register set location 620-0. This is represented in FIG. 6A by an arrow from a FREE_

CMPR.HEAD register 622 to FREE_CMPR_LIST register set location 620-0. Similarly, a FREE_CMPR.TAIL register 624 may point to a FREE_CMPR_LIST register set location 620-8. This is represented in FIG. 6A by an arrow drawn from a FREE_CMPR.TAIL register 624 to FREE_CMPR_LIST register set location 620-8.

Similarly, a BUSY_CMPR_LIST register set 626 may be initialized to create a list of busy CMPR index values. A BUSY_CMPR.HEAD register 628 may point to a BUSY_CMPR_LIST register set location 626-0. A BUSY_CMPR.TAIL register 630 may point to a BUSY_CMPR_LIST register set location 626-0.

A reset operation 500 may be subject to the variations, and alternative approaches noted in conjunction with a second embodiment.

Figure 5B:
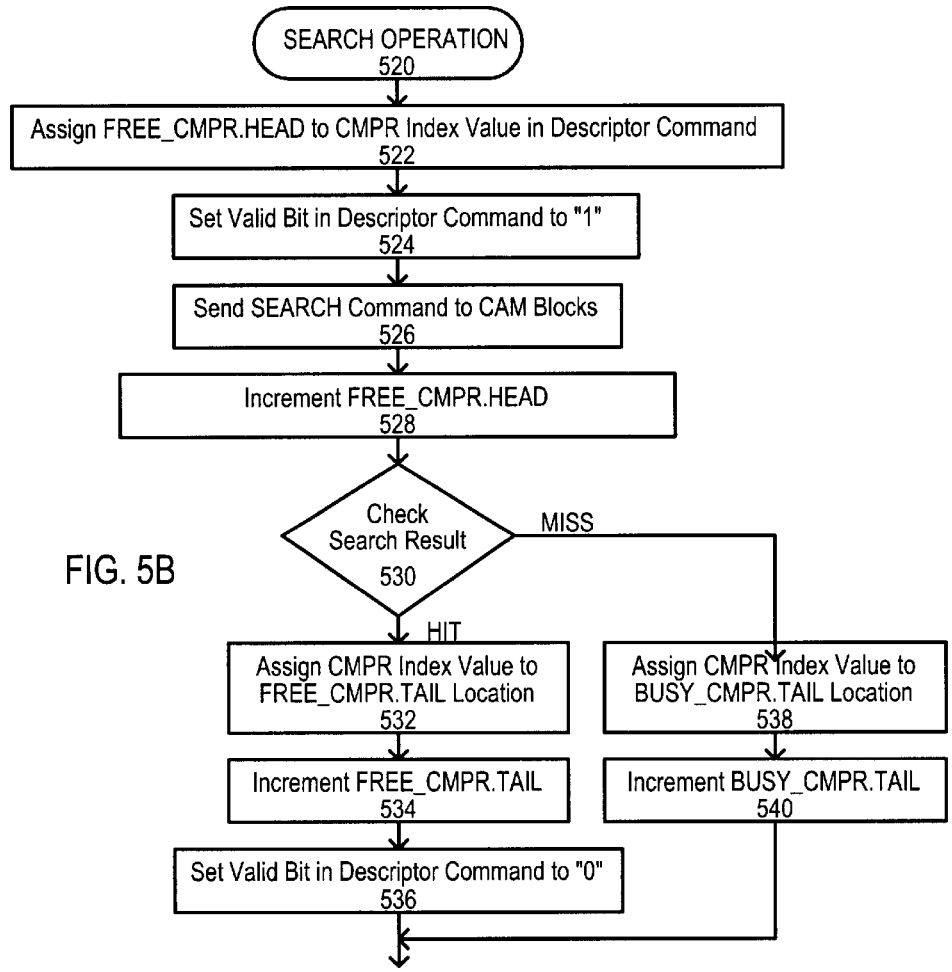

A search operation 520 according to a fourth embodiment will now be described with reference to FIG. 5B and FIGS. 6A and 6B.

A search operation 520 may differ from that of a second embodiment (220) in that various steps may take into account descriptor register operations. Thus, unlike a second embodiment, a fourth embodiment search operation 520 may include assigning a free head pointer to a comparand index value set forth in a descriptor command (step 522). Such a step is represented in FIG. 6B by a value CMPR Index 1 (formerly at free register set location 620-0) to a field 642 in descriptor command register set 638.

It is noted, however, that a fourth embodiment search operation may be issued according to a command descriptor. In particular, in the example described, such a search command may be issued according to a command descriptor at descriptor register set location 638-0.

A search operation 520 may then set a valid bit in a descriptor command (step 524). Such a valid bit may be in the same descriptor command of the previous step 522. Such a step is represented in FIG. 6B by a valid field 644 having a bit set to 1.

In this way, a descriptor command may be modified with register values prior to being sent to CAM blocks for a search operation.

A fourth embodiment search operation 520 may then proceed in the same general fashion as a second embodiment 220. In particular, steps 526, 528 and 530 may correspond to steps 226, 228 and 230, respectively.

Figure 6B:
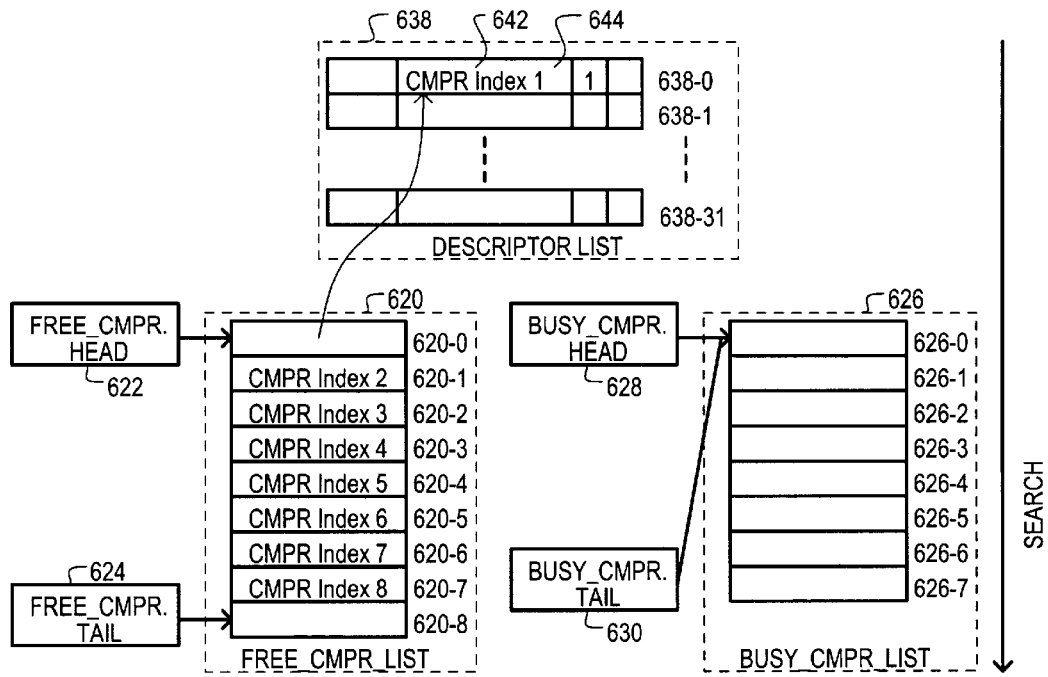

A step 528 is represented in FIG. 6B, by a free head register 622 being incremented to now point to a location 620-1.

Like the second embodiment search operation 220, a fourth embodiment search operation may proceed differently according to whether a check indicates in a search hit or a search miss (step 530).

As shown FIG. 6A, in the case of "hit" a search operation 520 may continue with the same general steps as a second embodiment, including assigning a CMPR index to FREE_CMPR.TAIL location 532 and incrementing a FREE_CMPR.TAIL value 534.

Figure 6C:
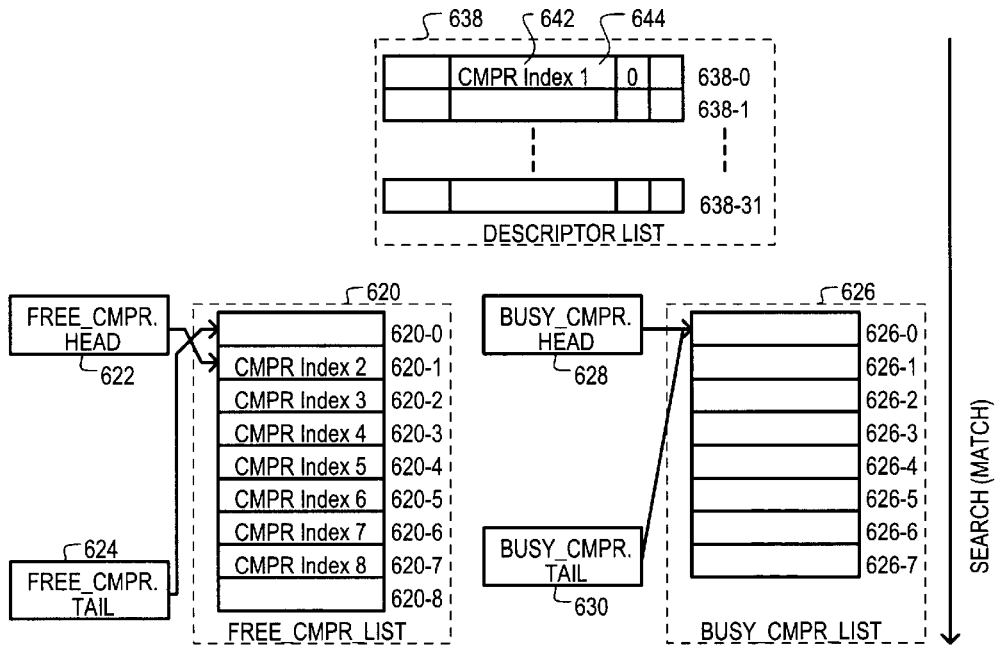

A step 532 is represented in FIG. 6C by a value CMPR Index 1 being assigned to register set location 620-8. Further, a step 534 is shown in FIG. 6C by a free tail register 624 pointing to location 620-0.

Unlike a second embodiment 220, a fourth embodiment search operation 520 may include modifying a descriptor command. In particular, a valid bit may be set in a descriptor command to an invalid value (step 536). A step 536 is shown in FIG. 6C by a valid field 644 bit in descriptor register 638-0 being set to a "0" after previously being a "1."

If checking a search result 530 indicates a "miss", then a search operation 520 may proceed in the same general fashion as a second embodiment 220, including assigning a CMPR index to BUSY_CMPR.TAIL location 538 and incrementing a BUSY_CMPR.TAIL value 540.

Figure 6D:
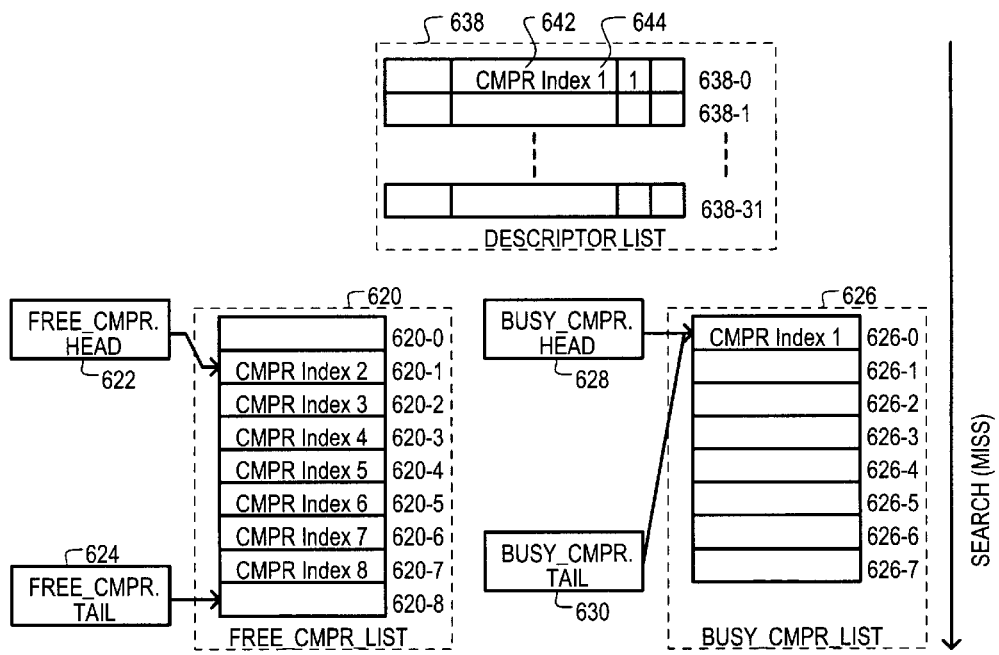

Steps 538 and 540 are represented in FIG. 6D, where a value CMPR Index 1 has been assigned to busy register set location 626-0, and busy tail register 630 has been incremented to point to busy register set location 626-1.

In this way a search operation according to a fourth embodiment, can alter a command descriptor, to thereby designate a comparand for use in a search operation. This may reduce a bookkeeping burden for an NPU or the like, thereby increasing performance of a system.

Figure 5C:
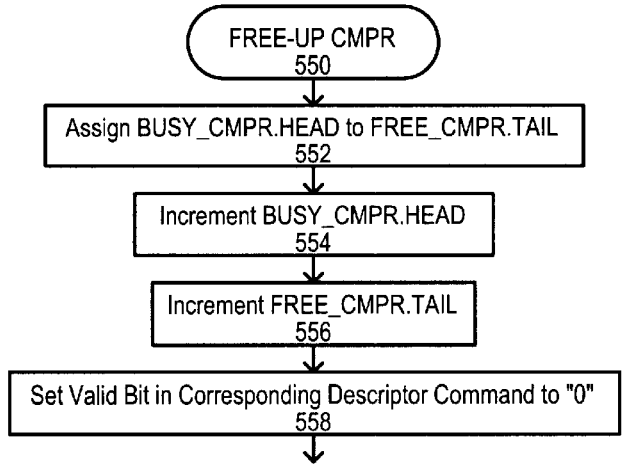
Figure 5D:
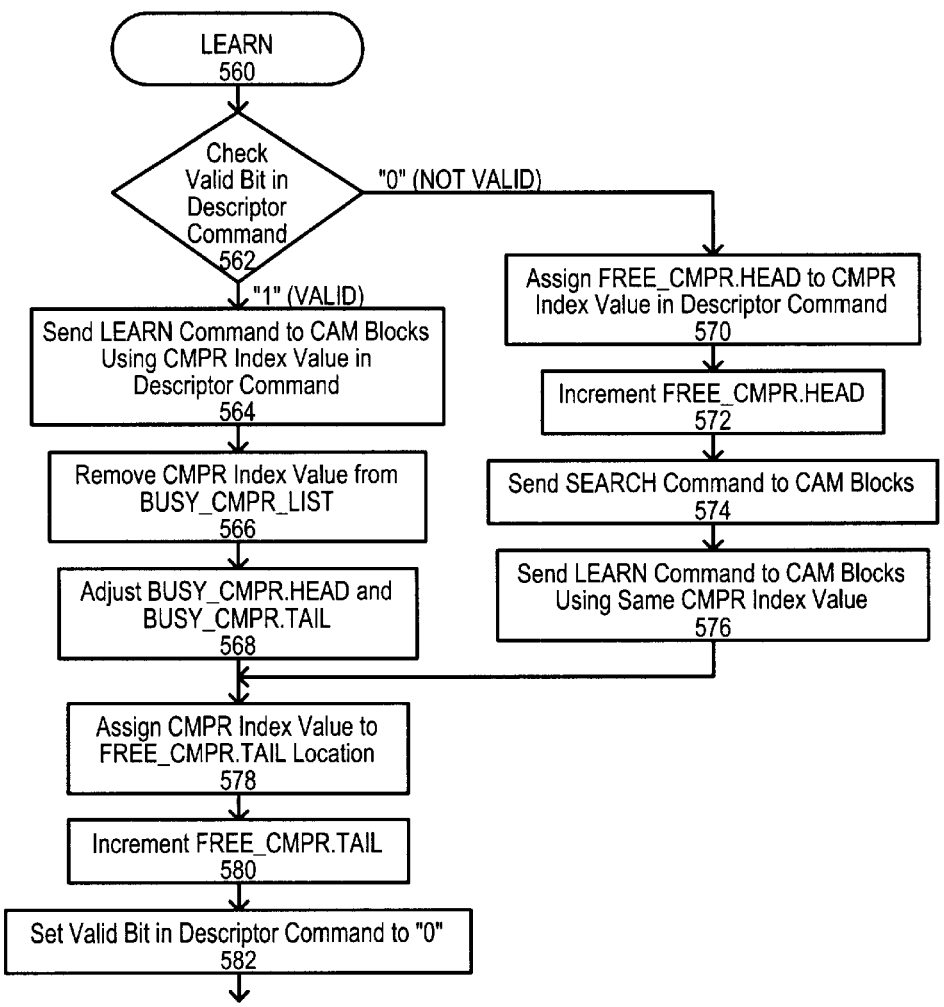
Figure 6E:
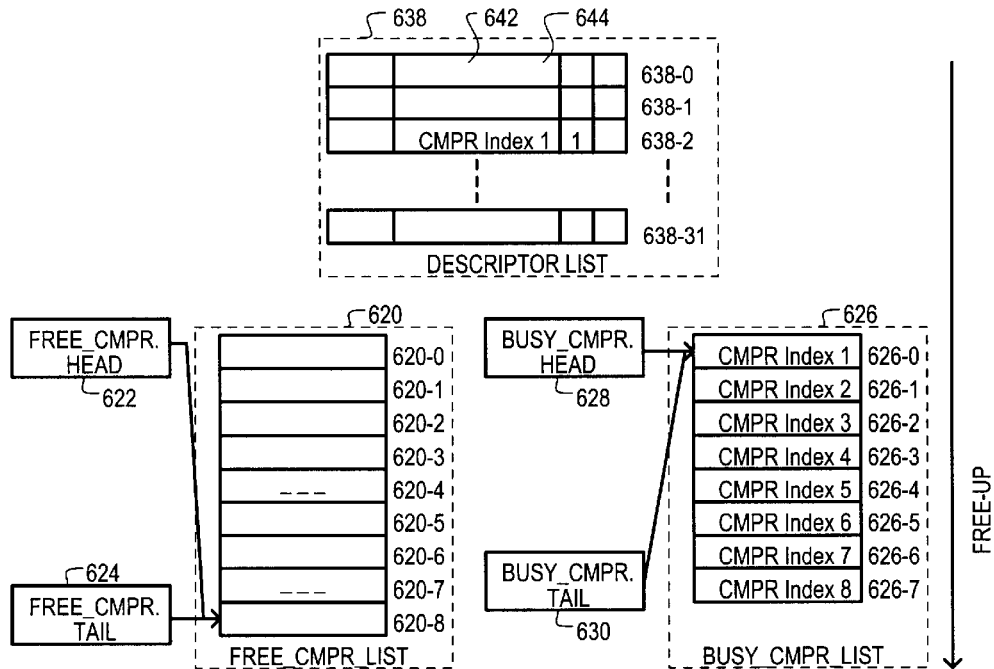
Figure 6F:
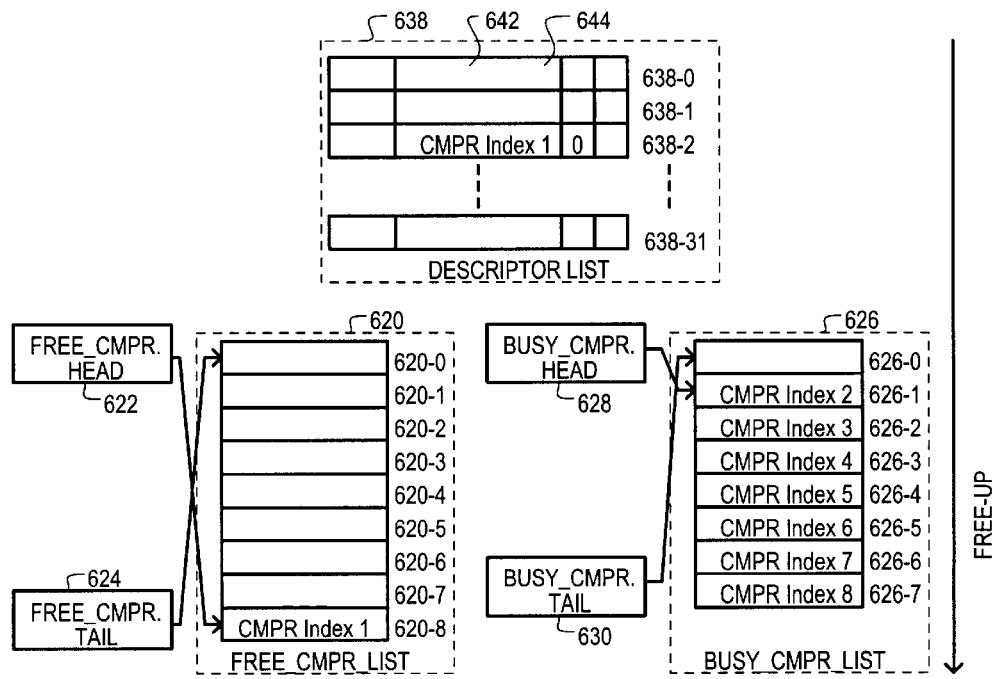

Referring now to FIGS. 5C, 6E and 6F a method of performing a free-up register operation according to a fourth embodiment will now be described. Such an operation is shown in FIG. 5C as a free-up CMPR operation, and designated by the general reference character 550.

A free CMPR operation 550 may follow the same general steps as a second embodiment free CMPR operation 250, including assigning a BUSY_CMPR.HEAD value to FREE_CMPR.TAIL value 552, incrementing a BUSY_CMPR.HEAD value 554, and incrementing a FREE_CMPR.TAIL value 556.

Steps 552 to 556 are represented in FIGS. 6E and 6F. It is assumed that FIG. 6E represents register states prior to a free CMPR operation 550. A step 552 is represented by a value CMPR Index 1, which was previously at busy register set location 626-0 (in FIG. 6E) being assigned to free register set location 620-0 in FIG. 6F. A step 554 is represented by a value busy head register 628, which was pointing to busy register set location 626-0 in FIG. 6E, being incremented to point to busy register set location 626-1 in FIG. 6F.

Unlike a second embodiment free-up CMPR operation 250, a fourth embodiment free-up CMPR operation 550 may also include marking a descriptor register entry as not valid. In the particular case of FIG. 5C, such a step may include setting a valid field 644 for a corresponding descriptor command to an invalid state (step 558).

A step 558 is represented in FIG. 6F by a valid field 444 bit for descriptor register entry 638-2 being set to a "0," indicating an invalid state. Such an operation can prevent a CMPR Index 1 value from being applied in a learn operation, or the like, and can enable such a comparand indexed to be subsequently utilized in a new search operation.

In this way, a free-up comparand operation register operation can alter a command descriptor, to thereby re-designate a comparand for use in a search operation instead of a pending compare operation, or the like. This may reduce a bookkeeping burden for an NPU or the like, thereby increasing performance of a system.

Figure 6G:
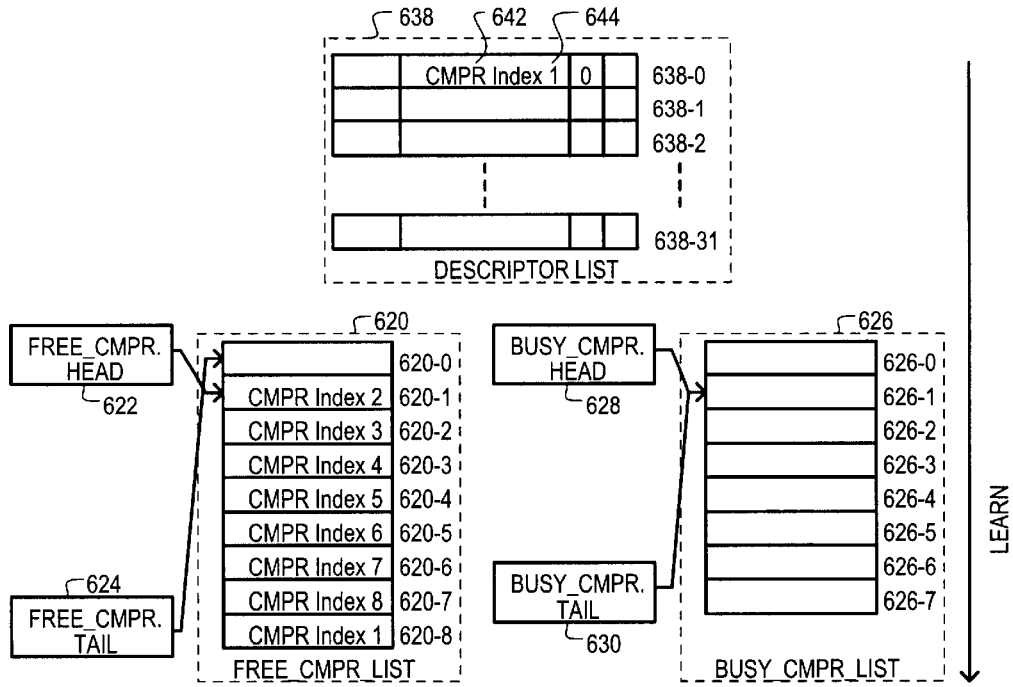
Figure 6H:
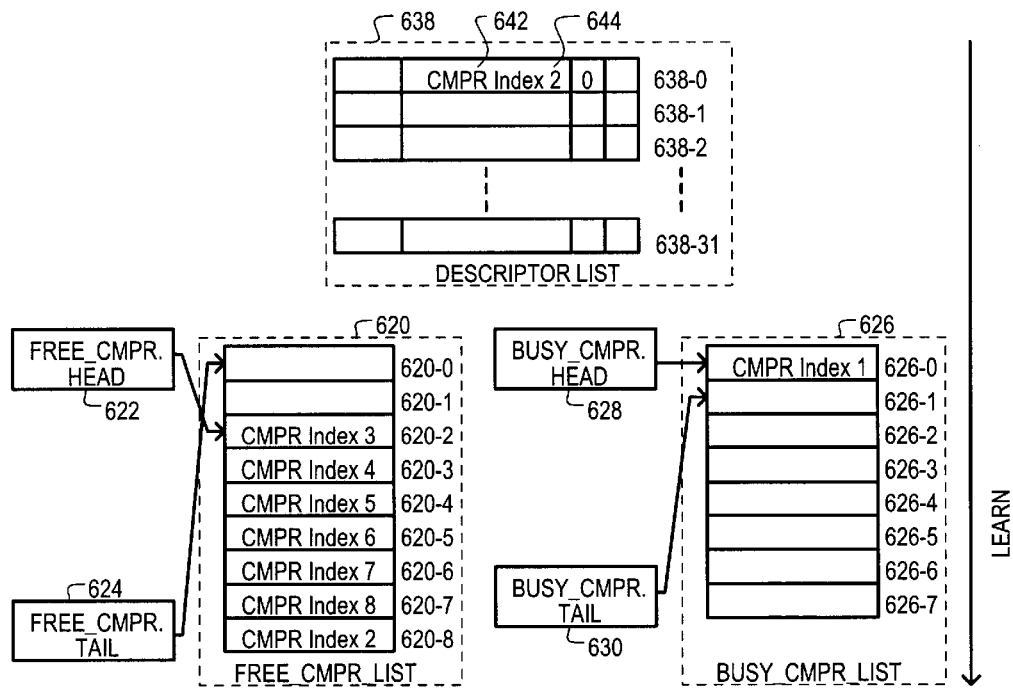

Referring now to FIGS. 5D, 6G and 6H, a learn operation 560 according to a fourth embodiment will now be described.

In a learn operation 560 according to a fourth embodiment may be issued according to a command descriptor. In particular, in example described below, a learn operation will be assumed to be issued according to a command descriptor at descriptor register set location 638-0.

A learn operation 560 according to a fourth embodiment may begin by checking the validity of the specified descriptor command location (step 562). If valid (e.g., a valid field 644 bit is "1"), a learn operation 560 may continue by sending a learn command to CAM blocks and then removing a corresponding comparand index value from a busy register set. In the particular example of FIG. 5D, such steps are shown as send LEARN command to CAM blocks using CMPR index value in descriptor command 564, remove CMPR index value from BUSY_CMPR_LIST 566, and adjust BUSY_CMPR.HEAD and BUSY_CMPR.TAIL 568.

In contrast, if a specified descriptor command location is not valid (e.g., a valid field 644 bit is "0"), a learn operation 560 may continue by sending a new search to CAM blocks, and then performing a new learn operation. In the particular example of FIG. 5D, such steps are shown as assign FREE_CMPR.HEAD to CMPR index value in descri ptor command 570, increment FREE_CMPR.HEAD 572, send SEARCH command to CAM blocks 574, and send LEARN command to CAM blocks using same CMPR index value 576.

In the example of FIG. 5D, regardless of which conditional path is taken in response to the validity of descriptor entry, a learn operation 560 may continue by freeing a busy register index used in a learn operation, and invalidating a descriptor entry corresponding to a completed learn operation. In the particular example of FIG. 5D, such steps are shown as: assign CMPR index value to FREE_CMPR.TAIL location 578, increment FREE_CMPR.TAIL 580, and set valid bit in descriptor command to "0" 582.

The above steps of a learn operation will now be described with reference to particular examples shown in FIGS. 6G and 6H.

The case of a valid descriptor command will first be described.

In such a case, a CMPR index field 644 in the specified descriptor command can be assumed to contain a valid CMPR index value. For example, such a CMPR index value may have been used in a previous search operation 520 that resulted in a "miss." Further, such a CMPR index value has not been subsequently re-used for another search operation 520 (e.g., re-designated by a free register operation).

Assuming that a descriptor command register set 638 and various free and busy comparand registers prior to performing the learn operation 560 are as depicted in FIG. 6D and that descriptor command register set location 638-0 has been specified for the learn operation, then the method of performing the learn operation 560 if the valid bit is "1" may continue as follows.

First, a learn command can be sent to CAM blocks (step 564) using a CMPR index value in a CMPR index field 642 of the specified descriptor command register set location (638-0 in this example). CAM blocks may then perform a learn operation. For example, a comparand value at the specified CMPR index location may be loaded into the CAM array at an available location, such as a "next free" or otherwise predetermined storage location.

Since a CMPR index value used for a learn operation is no longer needed, a learn operation 560 may continue by removing a CMPR index value from BUSY_CMPR_LIST (step 566) and adjusting a BUSY_CMPR.HEAD register 628 or BUSY_CMPR.TAIL register 630 accordingly.

FIG. 6G shows one example of the states of free and busy registers after a learn operation with valid bit "1". Comparing FIG. 6G to FIG. 6D, a "CMPR Index 1" comparand index value, which had been stored at BUSY_CMPR_LIST register set location 626-0, has been removed from a list of busy comparand index values by incrementing a BUSY_CMPR.HEAD register 628. As noted previously, a "removal" of the value may be accomplished by updating the pointer registers and not by physically removing the value from the register.

A learn operation 560 may continue by assigning the CMPR index value to a FREE_CMPR.TAIL location (step 578). That is, a comparand index value used for a learn operation may now be made available for new search operations. Referring to FIG. 6G, a comparand index "CMPR Index 1" that was used for the learn operation has been loaded into FREE_CMPR_LIST register set location 620-8, which was where a FREE_CMPR.TAIL register 622 was pointing to prior to a learn operation (see FIG. 6D).

A learn operation 560 may continue by incrementing a FREE_CMPR.TAIL register (step 580). This can adjust for the new value that has been added to a list of free comparand index values. Referring to FIG. 6G, a FREE_CMPR.TAIL register 622 now points to FREE_CMPR_LIST register set location 620-1.

A descriptor command register entry for an issued and/or completed learn operation may then be set to an invalid state (step 582). Referring to FIG. 6G, a step 582 is represented by a valid field 644 bit for the descriptor command register set location 638-0 being set to "0" (after previously being a "1"—see FIG. 6D).

The case of an invalid descriptor command will now be described.

Referring now back to step 562 in FIG. 5D, if a specified descriptor register entry is not valid (e.g., a valid field 644 bit is "0"), this can indicate that a CMPR index field 644 in the specified descriptor command may no longer be used in a learn operation. Such a state may occur when a CMPR index value of a learn operation has been reused for another search operation 520. As but one example, a free CMPR operation 550 may have been performed that has since designated the register as a free register.

In the non-valid descriptor case, an additional search operation may need to be done before the learn operation can continue.

As an example, it will be assumed that a descriptor command register set 638 and various free and busy comparand registers prior to performing a learn operation 560 have states as shown in FIG. 6D. However, unlike FIG. 6D it will be assumed that a valid field 644 bit is set to "0" instead of "1" in the descriptor command register set location 638-0 specified for the learn operation. A learn operation 560 may then continue as follows, with the end result as shown in FIG. 6H.

First, a FREE_CMPR.HEAD value may be assigned to a descriptor command (step 570). That is, a comparand index value stored in the FREE_CMPR_LIST register set 620 location pointed to by a FREE_CMPR.HEAD register 622 may be loaded into a CMPR index field 642 of the selected element of the descriptor command register set 638.

Referring to FIG. 6D, a FREE_CMPR.HEAD register 622 before the learn operation 560 may point to FREE_CMPR_LIST register set location 620-1. Referring to FIG. 6H, a "CMPR Index 2" value that had been stored in FREE_CMPR_LIST register set location 620-2 has now been transferred to the CMPR index field 624 of the specified descriptor command register set location 638-0.

A learn operation 560 may then continue by incrementing a FREE_CMPR.HEAD value (step 572). Such an operation may be performed because a FREE_CMPR_LIST register set 620 location previously pointed to has now been used.

Referring again to FIG. 6H, a FREE_CMPR.HEAD register 622 now points to FREE_CMPR_LIST register set location 620-2, which is the contains the next available CMPR index in a list of free comparand index values.

As shown in FIG. 5D, the non-valid case may continue by sending a search command to the CAM blocks (step 574). Such a search command can use a new CMPR index value that has been assigned to the descriptor command. It can be assumed that such a search can result in a miss (since the previous search had the same result).

A search miss can serve to transfer a comparand value for the specified descriptor command to a new comparand register so that a learn operation may be performed for that comparand value.

After a search command is completed, a learn command can be sent to the CAM blocks using the same CMPR index value that was used for the search (step 576).

A learn operation 560 may then proceed in the same fashion as described above (steps 578, 580 and 582).

In this way, a learn operation 560 may execute a new search result, when a descriptor for a learn command is no longer valid. Such a new search result may place a comparand index in a busy register set, and therefore available for a new learn operation.

A fifth embodiment will now be described with reference to a number of block diagrams showing the states of various descriptor registers for selected operations. A fifth embodiment is shown in FIGS. 7A to 7E. Each of FIGS. 7A to 7E illustrates a descriptor command register set 738 that includes a number of command register locations, three of which are shown as 738-0 to 738-2.

Each command register location (738-0 to 738-2) can include a number of fields. In the example of FIGS. 7A to 7E, four particular fields are illustrated: a command valid field 746, a command field 748, a CMPR index field 742, and a comparand index valid field 744.

A command valid field 746 may indicate when a command for a given descriptor command register location is valid (e.g., is to be executed by a CAM block, or the like). A command field 748 may store a command that may be executed by a CAM block, or the like. A CMPR index field 742 can be essentially that same as that shown as item 642 in FIG. 6A. Similarly, a comparand index valid field 744 may be essentially the same as the valid bit shown as 644 in FIG. 6A.

Figure 7A:
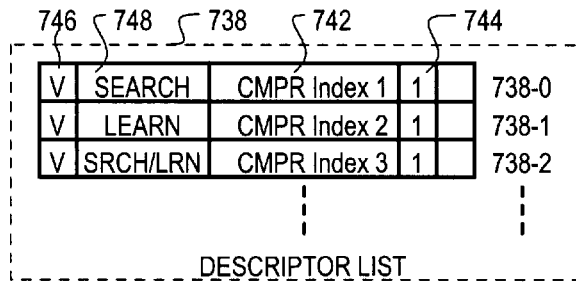
FIGS. 7A, 7B, 7C, 7D and 7E are block diagrams illustrating descriptor registers and operations according to a fifth embodiment.

FIG. 7A shows one example of an initial state for command register locations (738-0 to 738-2). Three commands have been stored, a search command (SEARCH) at location 738-0, a learn command (LEARN) at location 738-1, and a search-then learn command (SRCH/LRN) at location 738-2. The commands for locations 738-0 to 738-2 can use comparand values indicated by registers CMPR Index 1 to 3, respectively.

It is noted that each type of command may be issued by an NPU or other device that utilizes the capabilities of CAM-type circuits in a system. A SEARCH command may be executed as described above in FIGS. 2B, or 3B–3D, or 5B, or 6B–6D.

Figure 7B:
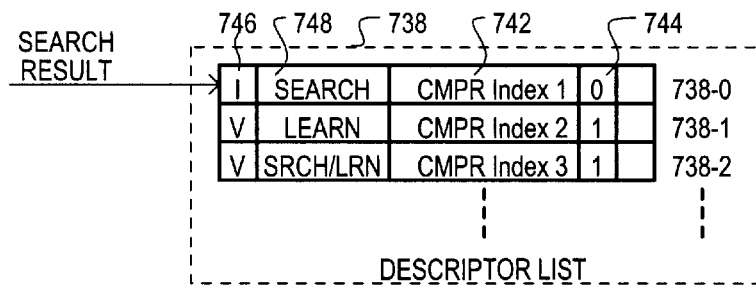

FIG. 7B shows a descriptor command register set 738 following a completed SEARCH command. It is assumed that the search resulted in a "hit." Consequently, a command register location 738-0 may be made available for other operations. Thus, an index valid field 744 may be set to an invalid indication ("0") and a command valid field 746 may be set to an invalid indication ("I").

Of course, while a particular field (command valid field 746) has been utilized to distinguish valid/invalid descriptor commands, pointers or the like may also be used, as but one alternate example.

Figure 7C:
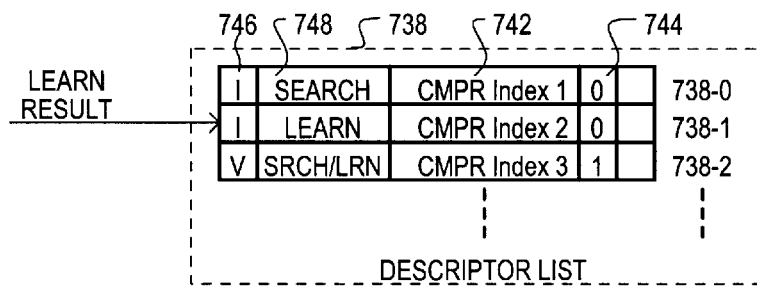

FIG. 7C shows a descriptor command register set 738 following the completion of a LEARN command stored at location 738-1. It is assumed that the learn command was successful. Consequently, a command register location 738-1 may be made available for other operations. Thus, an index valid field 744 may be set to an invalid indication ("0") and a command valid field 746 may be set to an invalid indication ("I").

Figure 7D:
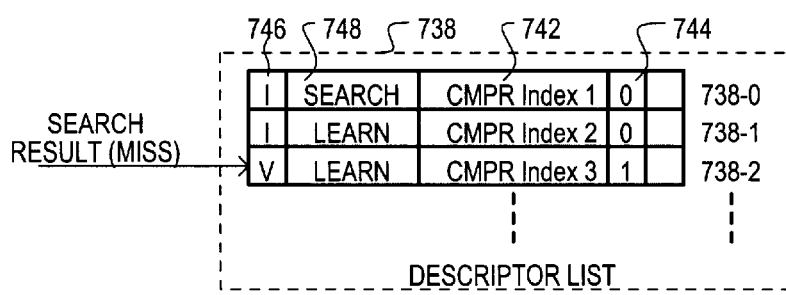
Figure 7E:
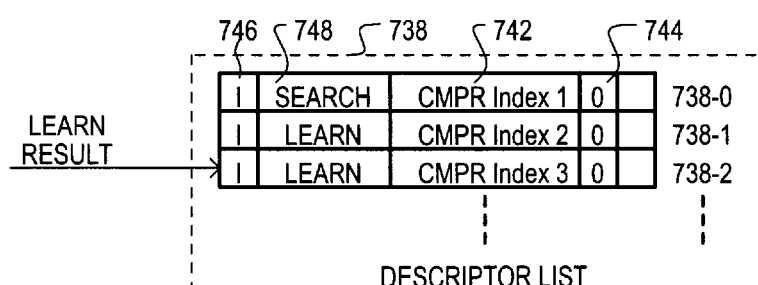

FIGS. 7D and 7E show the execution of search-then-learn command stored at location 738-2. In a search-then-learn command, a search operation may be executed. If a search results in "hit" the operation may proceed in the same general fashion as a search command: a descriptor command entry and index field for the search-then-learn command may be made available for other operation.

However, if the initial search of a search-then-learn command is a miss, a learn command for the same comparand value may be automatically executed. This may eliminate the need for an NPU to issue a learn command following a search miss. That is, a single search-then-learn command may be issued for cases where a learn is desired. This can free-up bandwidth in a system by reducing the number of commands that need to be executed by an NPU, or the like.

FIG. 7D shows a descriptor command register set 738 following an initial search in a search-then-learn command. It is assumed that the initial search results in a miss. Thus, rather than "clear" a register location 738-2, a register location 738-2 (including CMPR Index 3) may continue to be available for a subsequent learn command. In the example of FIG. 7D, an actual command field 748 may be changed from a SRCH/LRN value to a LEARN value. However, this is but one possible example. A system may be automatically programmed and/or designed to assume a first access to a SRCH/LRN command may be a search and a second access may be a learn. Further, similar results could be achieved by moving a pointer or actual position of a descriptor command entry. Still further, some intermediate circuit could store the SRCH/LRN command, and simply clear register location 738-2 once such a command is completed.

FIG. 7E shows one example of the completion of a SRCH/LLRN command stored at location 738-2. It is assumed that the learn command was successful. Consequently, a command register location 738-2 may be made available for other operations. Thus, an index valid field 744 may be set to an invalid indication ("0") and a command valid field 746 may be set to an invalid indication ("I").

Figure 8:
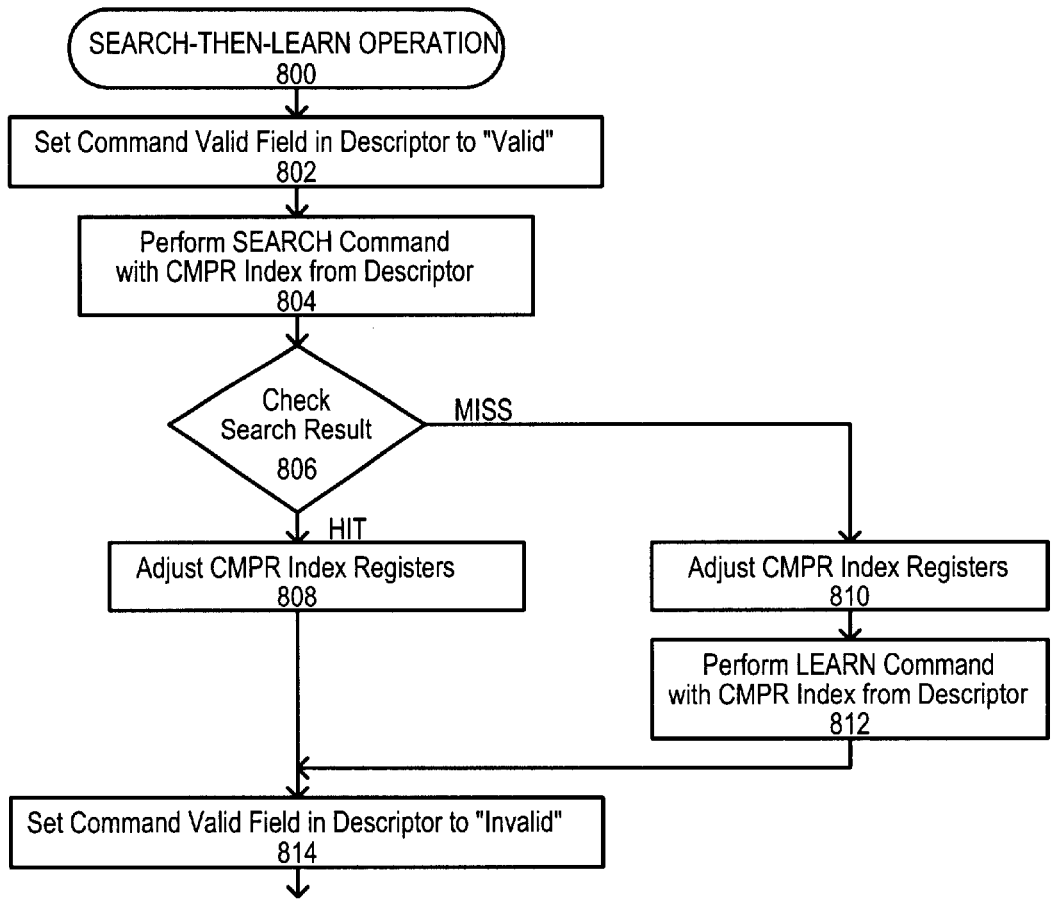
FIG. 8 is a block diagram showing a search-then-learn operation according to a fifth embodiment.
Figure 9A:
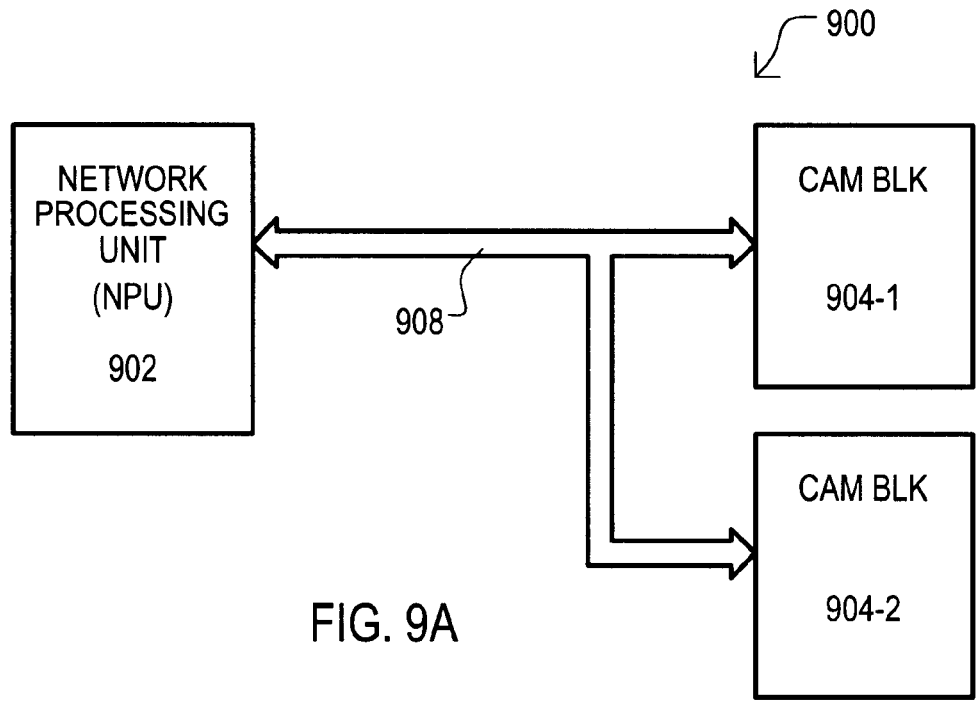
FIGS. 9A and 9B are block diagrams showing a conventional CAM system.
Figure 9B:
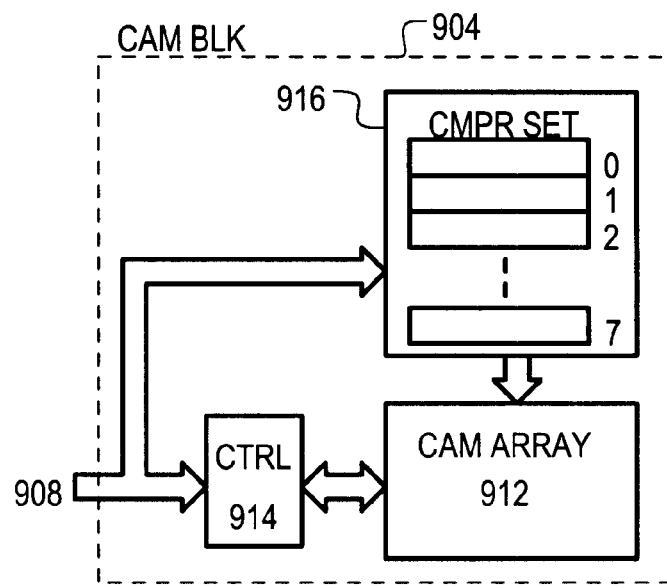

A method for a search-then-learn operation according to a fifth embodiment is shown in FIG. 8, and designated by the reference character 800. A search-then-learn operation 800 may include setting a command valid field to a valid state (step 802). A search operation may then be performed with a CMPR index from the descriptor corresponding to the search-then-learn command (step 804). In particular arrangements, a step 804 may include performing the steps 222 to 228 of FIG. 2B or steps 522 to 528 of FIG. 5B.

A search and learn operation may then check a search result (step 806).

If a search result indicates a hit, a search-then-learn operation 800 may adjust CMPR index registers in response (step 808). In particular arrangements, a step 804 may include performing the steps 232 to 234 of FIG. 2B or steps 532 to 536 of FIG. 5B.

If a search result indicates a miss, a search-then-learn operation 800 may adjust CMPR index registers in response (step 810). In particular arrangements, a step 810 may include performing the steps 238 to 240 of FIG. 2B or steps 538 to 540 of FIG. 5B. Further, in very particular embodiments, a command register value could actually be changed from one value SRCH/LRN to another value LEARN.

A search-then-learn operation 800 may then proceed by executing a learn command with the same CMPR Index value (step 812). In particular arrangements, a step 804 may proceed as illustrated in FIG. 2D or FIG. 5D.

As shown in FIG. 8, once CMPR Index Registers are adjusted in response to a hit (step 808) or a learn command has been executed (step 812), a command valid field in a descriptor may be set to an invalid state (814).

In this way, a CAM-type system may be capable of receiving a particular search-then-learn command in addition to search or learn commands. Such a capability may improve performance as a single command (search-then-learn) may be issued by an NPU, or the like, instead of a search command followed by a learn command.

It is understood that while the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM) system comprising:
   a free index list having a plurality of locations that store indexes corresponding to comparand values for use in search operations; and
   a busy index list having a plurality of locations for storing indexes corresponding to comparand values reserved for non-search operations.

2. The CAM system of claim 1, wherein:
   the free index list comprises a plurality of registers that store indexes to comparand registers locations.

3. The CAM system of claim 1, wherein:
   the busy index list comprises a plurality of registers for storing indexes to comparand register locations.

4. The CAM system of claim 1, further including:
   a free list head pointer that indicates a first free index list location storing a valid index; and
   a free list tail pointer that indicates a last free index list location storing a valid index.

5. The CAM system of claim 1, further including:
   a busy list head pointer that indicates a first busy index list location that stores a valid index; and
   a busy list tail pointer that indicates a last busy index list location that stores a valid index.

6. The CAM system of claim 1, further including:
   a descriptor command list having a plurality of locations for storing values for commands issued to CAM cells, each descriptor command list location including an index field for storing an index value and a valid field for storing a valid indication.

7. The CAM system of claim 1, further including:
   at least one CAM block that includes at least one array of content addressable memory cells, and
   a comparand register for storing a plurality of comparand values; wherein
   the indexes correspond to comparand register locations.

8. A method of monitoring comparand storage locations in a CAM system, comprising the steps of:
   assigning a comparand index value to a free comparand list;
   comparing a comparand corresponding to the comparand index value with a plurality of CAM locations;
   if the comparand matches a CAM location, removing the comparand index value from the free compare list; and
   if the comparand does not match a CAM location, assigning the comparand index value corresponding to the comparand to a busy comparand list.

9. The method of claim 8, wherein:
   assigning the comparand index value to the free comparand list includes assigning the comparand index value to a free list location indicated by a free head pointer; and
   removing the comparand index from the free compare list includes assigning the comparand index value to a free list location indicated by a free tail pointer and then incrementing the free tail pointer.

10. The method of claim 8, wherein:
    assigning the comparand index value to the busy comparand list includes assigning the comparand index value to a busy list location indicated by a busy tail pointer and then incrementing the busy tail pointer.

11. The method of claim 8, further including:
    prior to comparing the comparand with the plurality of CAM locations, setting a valid indication in a descriptor corresponding to the compare operation to a valid state.

12. The method of claim 8, further including:
    after removing the comparand index value from the free compare list, setting a valid indication in a descriptor corresponding to the compare operation to an invalid state.

13. The method of claim 8, further including:
    freeing up at least one location of the busy comparand list when there are no more available free comparand list locations.

14. The method of claim 13, wherein:
    freeing up at least one location of the busy comparand list further includes setting a valid indication in a descriptor corresponding to the at least one busy comparand list location to an invalid state.

15. A method of monitoring comparand storage locations in a content addressable memory (CAM) system, comprising the steps of:
    a) executing a learn operation that stores a comparand value in a predetermined CAM location, the comparand value being identified by a comparand index value stored in a busy comparand list; and
    b) moving the comparand index value from the busy comparand list to a free comparand list.

16. The method of claim 15, wherein:
    the learn operation is executed according to a descriptor, and the method further includes examining a descriptor valid indication, and if the descriptor is valid, performing steps a) and b) and then setting the valid indication to invalid.

17. The method of claim 16, further including:

if the descriptor is not valid, searching CAM locations with the comparand value and assigning the comparand index corresponding to the comparand value to the busy comparand list; and performing steps a) and b) with the comparand value.

18. The method of claim 15, further including:

in response to a predetermined command, executing a search operation with a comparand value identified by a comparand index value and if the search operation yields a miss result, automatically executing the learn operation with the comparand value.

19. The method of claim 18, further including:

storing the predetermined command with the comparand index value prior to executing the search operation.

20. The method of claim 18, further including:

the predetermined command and comparand index value are stored in a register location; and the register location is made available for other commands if the search operation yields a hit result or the learn operation is completed.

* * * * *